(12) United States Patent
Bhuwalka et al.

(10) Patent No.: US 11,515,391 B2
(45) Date of Patent: Nov. 29, 2022

(54) SEMICONDUCTOR DEVICE

(71) Applicant: SAMSUNG ELECTRONICS CO., LTD., Suwon-si (KR)

(72) Inventors: Krishna Kumar Bhuwalka, Suwon-si (KR); Seong-Je Kim, Gwacheon-si (KR); Jong-Chol Kim, Seoul (KR); Hyun-Woo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 224 days.

(21) Appl. No.: 17/070,221

(22) Filed: Oct. 14, 2020

(65) Prior Publication Data
US 2021/0050415 A1 Feb. 18, 2021

Related U.S. Application Data

(60) Continuation of application No. 16/248,983, filed on Jan. 16, 2019, now Pat. No. 10,840,332, which is a
(Continued)

(30) Foreign Application Priority Data
Mar. 2, 2016 (KR) .......... 10-2016-0025167

(51) Int. Cl.
*H01L 29/06* (2006.01)
*H01L 29/66* (2006.01)
(Continued)

(52) U.S. Cl.
CPC .......... *H01L 29/0665* (2013.01); *B82Y 10/00* (2013.01); *H01L 21/823412* (2013.01); *H01L 21/823456* (2013.01); *H01L 29/0673* (2013.01); *H01L 29/1037* (2013.01); *H01L 29/42376* (2013.01); *H01L 29/42392* (2013.01);
(Continued)

(58) Field of Classification Search
CPC ............... H01L 29/42392; H01L 29/0673
See application file for complete search history.

(56) References Cited

U.S. PATENT DOCUMENTS 7,229,884 B2 6/2007 Park
7,544,572 B2 6/2009 Pan et al.
(Continued)

FOREIGN PATENT DOCUMENTS

CN 001702843 A 11/2005
CN 104011868 A 8/2014
(Continued)

OTHER PUBLICATIONS

Office Action dated Jan. 11, 2011 from the Chinese Patent Office for Chinese Patent for corresponding Chinese Application No. 201710120178.3.

*Primary Examiner* — Amar Movva
(74) *Attorney, Agent, or Firm* — Lee IP Law, P.C.

(57) ABSTRACT

A semiconductor device includes a plurality of channels, source/drain layers, and a gate structure. The channels are sequentially stacked on a substrate and are spaced apart from each other in a first direction perpendicular to a top surface of the substrate. The source/drain layers are connected to the channels and are at opposite sides of the channels in a second direction parallel to the top surface of the substrate.
(Continued)

The gate structure encloses the channels. The channels have different lengths in the second direction and different thicknesses in the first direction.

20 Claims, 35 Drawing Sheets

Related U.S. Application Data division of application No. 15/296,077, filed on Oct. 18, 2016, now Pat. No. 10,217,816.

(51) Int. Cl.
| | | |
|---|---|---|
| *H01L 29/423* | (2006.01) | |
| *B82Y 10/00* | (2011.01) | |
| *H01L 29/775* | (2006.01) | |
| *H01L 29/10* | (2006.01) | |
| *H01L 29/786* | (2006.01) | |
| *H01L 21/8234* | (2006.01) | |

(52) U.S. Cl.
CPC .. *H01L 29/66439* (2013.01); *H01L 29/66545* (2013.01); *H01L 29/775* (2013.01); *H01L 29/78696* (2013.01)

(56) References Cited

U.S. PATENT DOCUMENTS

| | | |
|---|---|---|
| 8,829,625 B2 | 9/2014 | Sleight et al. |
| 9,064,729 B2 | 6/2015 | Liu |
| 9,240,410 B2 | 1/2016 | Then et al. |
| 9,590,089 B2 | 3/2017 | Rachmady et al. |
| 2007/0048938 A1 | 3/2007 | Yun et al. |
| 2007/0126035 A1 | 6/2007 | Ernst et al. |
| 2013/0307513 A1 | 11/2013 | Then et al. |
| 2013/0313524 A1 | 11/2013 | De Micheli et al. |
| 2014/0209855 A1 | 7/2014 | Cea et al. |
| 2014/0353574 A1 | 12/2014 | Li et al. |
| 2015/0243733 A1 | 8/2015 | Yang et al. |
| 2015/0295084 A1 | 10/2015 | Obradovic et al. |
| 2016/0027929 A1 | 1/2016 | Cheng et al. |
| 2017/0162579 A1 | 6/2017 | Choi et al. |

FOREIGN PATENT DOCUMENTS

| | | |
|---|---|---|
| CN | 104054181 A | 9/2014 |
| CN | 104517847 A | 4/2015 |
| JP | 2011-029503 A | 2/2011 |

SEMICONDUCTOR DEVICE

CROSS-REFERENCE TO RELATED APPLICATIONS

This is a continuation of U.S. patent application Ser. No. 16/248,983 filed Jan. 16, 2019, which is a division of U.S. patent application Ser. No. 15/296,077, filed Oct. 18, 2016, now U.S. Pat. No. 10,217,816 issued Feb. 26, 2019, the entire contents of each is hereby incorporated by reference.

Korean Patent Application No. 10-2016-0025167, filed on Mar. 2, 2016, and entitled, "Semiconductor Device," is incorporated by reference herein in its entirety.

BACKGROUND

1. Field

One or more embodiments described herein relate to a semiconductor device.

2. Description of the Related Art

A multi-bridge channel field effect transistor (MBCFET) may be formed by laminating nanosheets on a substrate and then patterning the nanosheets to form channels. Source/drain layers are formed at opposite sides of the channels and are doped with dopants. The dopants may be doped at opposite end portions of the channels. A doping profile of the dopants in each of the channels may have a non-vertical side profile relative to a top surface of the substrate. Thus, an effective gate length in a top channel is less than an effective gate length in a bottom channel.

SUMMARY

In accordance with one or more embodiments, a semiconductor device includes a plurality of channels sequentially stacked on a substrate, the plurality of channels spaced apart from each other in a first direction perpendicular to a top surface of the substrate; source/drain layers at opposite sides of the plurality of channels in a second direction parallel to the top surface of the substrate, the source/drain layers connected to the plurality of channels; and a gate structure enclosing the plurality of channels, wherein the plurality of channels have different lengths in the second direction and different thicknesses in the first direction.

In accordance with one or more other embodiments, a semiconductor device includes a pair of first semiconductor patterns on a substrate, the pair of first semiconductor patterns spaced apart from each other in a first direction parallel to a top surface of the substrate; a second semiconductor patterns between the pair of first semiconductor patterns and connected to the pair of first semiconductor patterns, the second semiconductor patterns spaced apart from each other in a second direction perpendicular to the top surface of the substrate; and a gate structure between the pair of first semiconductor and covering the second semiconductor patterns, wherein each of the second semiconductor patterns includes a central portion between end portions in the first direction, the end portions of the second semiconductor patterns including a same impurity as the pair of first semiconductor patterns, and the central portions of the second semiconductor patterns having different lengths and different thicknesses from each other.

In accordance with one or more other embodiments, a semiconductor device includes a gate structure on a substrate; epitaxial layers at opposite sides of the gate structure in a first direction parallel to a top surface of the substrate; a plurality of semiconductor patterns extending from the epitaxial layers in the first direction to pass through the gate structure, the plurality of semiconductor patterns spaced apart from each other in a second direction perpendicular to the top surface of the substrate; source/drain layers in respective ones of the epitaxial layers and including extension portions extending from the epitaxial layers to respective end portions of the plurality of semiconductor patterns; and a plurality of channels in the plurality of semiconductor patterns, the plurality of channels between the respective end portions of the plurality of semiconductor patterns and spaced apart from each other in the second direction, wherein the plurality of channels have different lengths in the first direction from each other and different thickness in the second direction from each other.

In accordance with one or more other embodiments, a semiconductor device includes a plurality of patterns stacked on a substrate and a plurality of gate electrodes on respective ones of the patterns, wherein the patterns include channels and wherein lengths of the channels or gate electrodes progressively change to offset a progressive change in thicknesses of the channels or gate electrodes in a predetermined direction.

In accordance with one or more other embodiments, a method for manufacturing a semiconductor device includes forming a plurality of channels sequentially stacked on a substrate, the plurality of channels spaced apart from each other in a first direction perpendicular to a top surface of the substrate; forming source/drain layers at opposite sides of the plurality of channels in a second direction parallel to the top surface of the substrate, the source/drain layers connected to the plurality of channels; and forming a gate structure enclosing the plurality of channels, wherein the plurality of channels have different lengths in the second direction and different thicknesses in the first direction.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
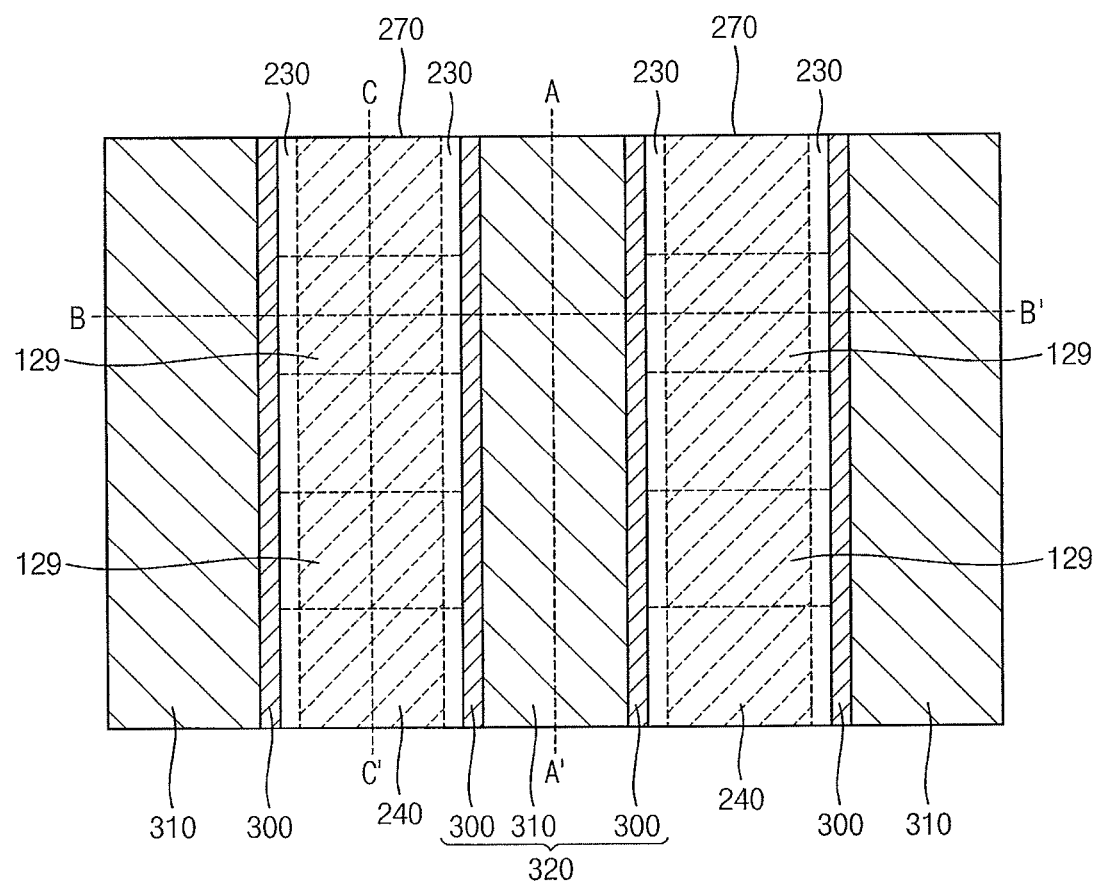
FIGS. 1 through 4 illustrate an embodiment of a semiconductor device.
Figure 1:
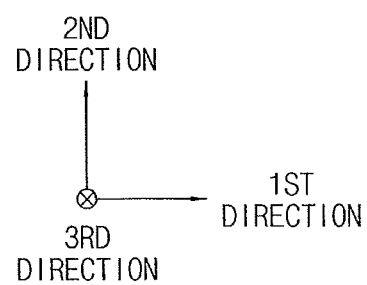
Figure 2:
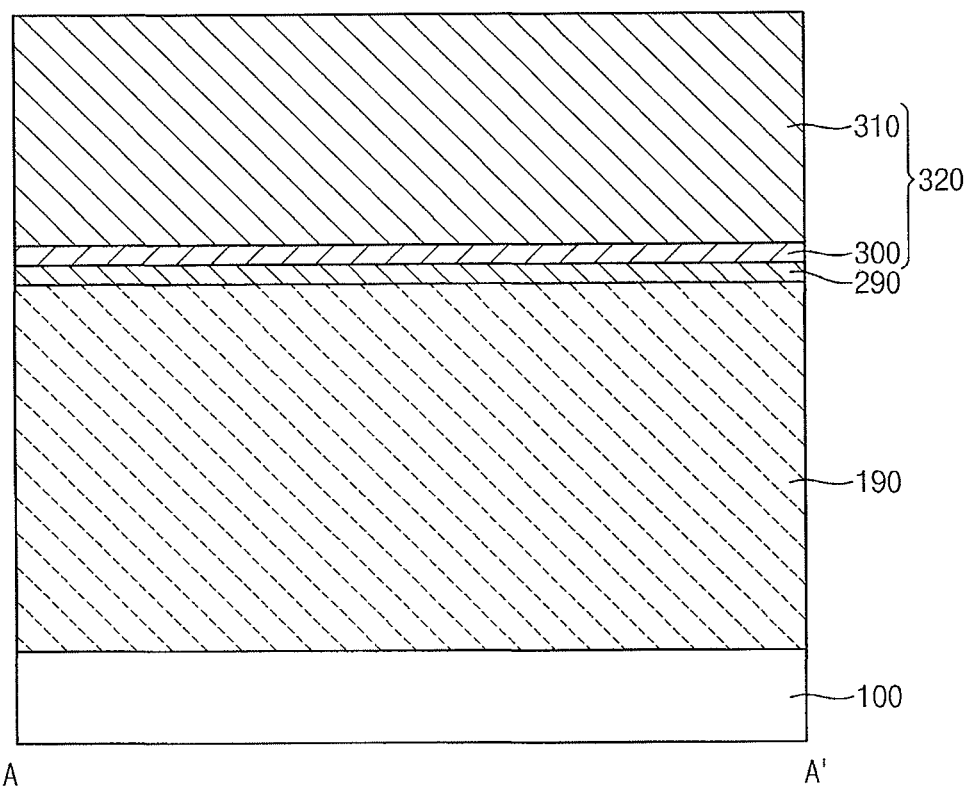
Figure 2:
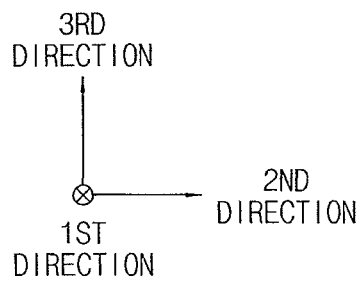
Figure 3:
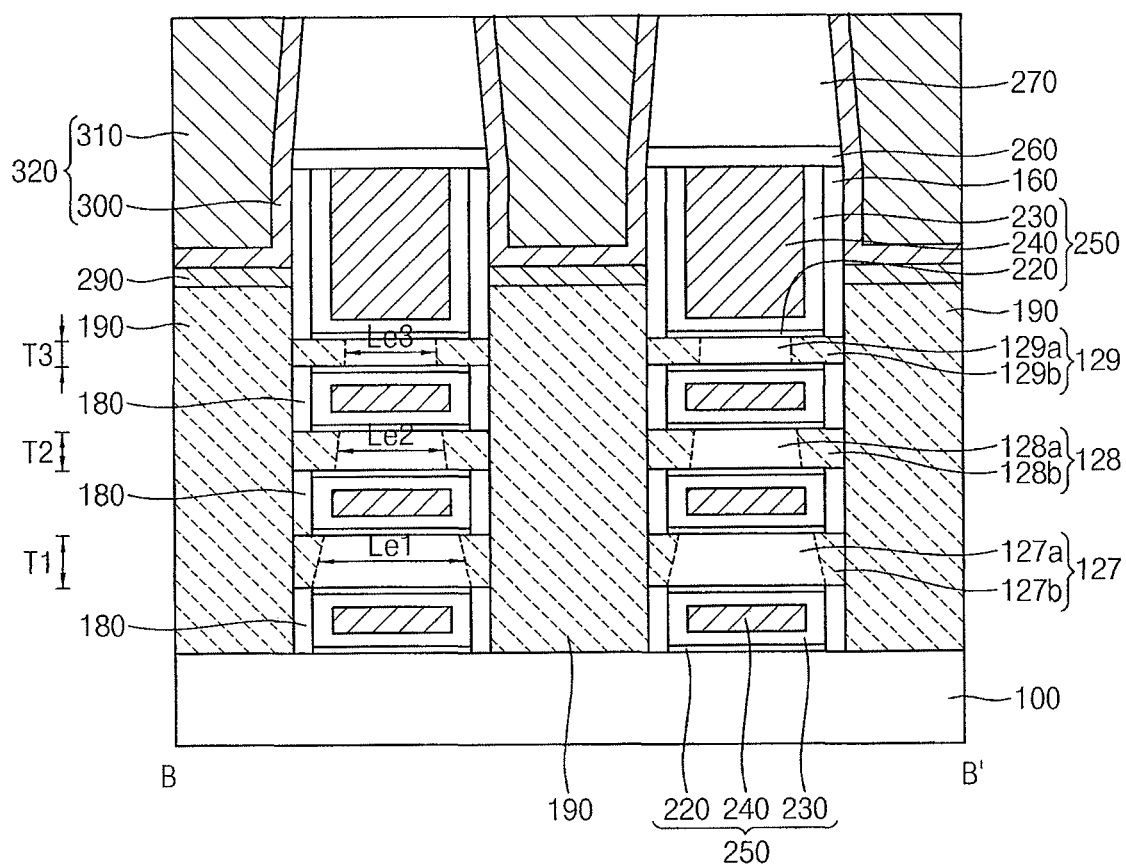
Figure 4:
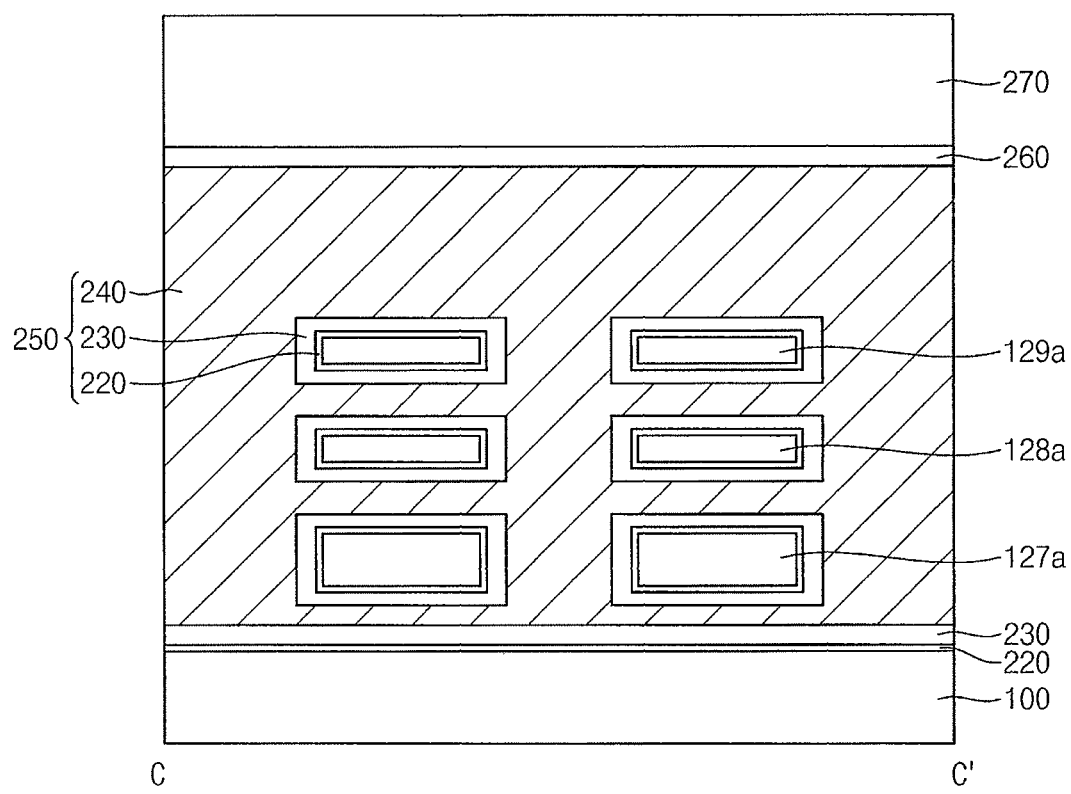
Figure 4:
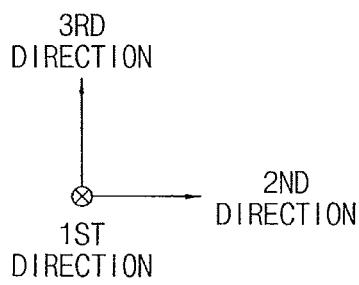

FIGS. 1 through 4 illustrate an embodiment of a semiconductor device. In particular, FIG. 1 illustrates a plan view of the semiconductor device. FIG. 2 illustrates a cross-sectional view taken along line A-A' in FIG. 1. FIG. 3 illustrates a cross-sectional view taken along line B-B' in FIG. 1. FIG. 4 illustrates a cross-sectional view taken along line C-C' in FIG. 1.

Referring to FIGS. 1 through 4, the semiconductor device may include first through third semiconductor patterns 127, 128, and 129, a fourth semiconductor layer 190, and a gate structure 250 which are formed on a substrate 100. In addition, the semiconductor device may include a gate spacer 160, an inner spacer 180, an insulating layer 200 (refer, e.g., to FIG. 24), a capping layer 260, an interlayer insulating layer 270, a metal silicide pattern 290, and a contact plug 320.

The substrate 100 may include a semiconductor material such as silicon, germanium or silicon-germanium or a III-V group compound semiconductor such as GaAs, AlGaAs, InAs, InGaAs, InSb, GaSb, InGaSb, InP, GaP, InGaP, InN, GaN or InGaN. In some embodiments, the substrate 100 may be a silicon-on-insulator (SOI) substrate or a germanium-on-insulator (GOI) substrate.

The first through third semiconductor patterns 127, 128, and 129 may be sequentially stacked on the substrate 100 in a third direction substantially perpendicular to a top surface of the substrate 100 and spaced apart from each other. Further, a plurality of each of the first through semiconductor patterns 127, 128, and 129 may be formed along first and second directions, which are parallel to the top surface of the substrate 100 and are orthogonal to each other. In some embodiments, each of the first through third semiconductor patterns 127, 128, and 129 may include a nanosheet. In other embodiments, each of the first through third semiconductor patterns 127, 128, and 129 may include a nanowire.

Each of the first through semiconductor patterns 127, 128, and 129 may include a central portion between opposite end portions and positioned in the first direction. For example, the first semiconductor pattern 127 may include a first central portion 127a and first end portions 127b. The second semiconductor pattern 128 may include a second central portion 128a and second end portions 128b. The third semiconductor pattern 129 may include a third central portion 129a and third end portions 129b.

The first through third end portions 127b, 128b, and 129b of the first through third semiconductor patterns 127, 128, and 129 may be doped with n-type impurities or p-type impurities. The first through third central portions 127a, 128a, and 129a of the first through third semiconductor patterns 127, 128, and 129 may not be doped or may be doped with impurities of conductivity type opposite to those in the first through third end portions 127b, 128b, and 129b. Therefore, the first through third end portions 127b, 128b, and 129b may be distinguished from the first through third central portions 127a, 128a, and 129a.

The first through third end portions 127b, 128b, and 129b of the first through third semiconductor patterns 127, 128, and 129 may have lengths in the first direction that gradually decrease in a downward direction (e.g., in a direction from an upper level position toward a lower level position). Thus, the first through third central portions 127a, 128a, and 129a may have lengths in the first direction that gradually increase in the downward direction. For example, the third end portions 129b at the upper level position may have a length greater than a length of the second end portions 128b at an intermediate level position, in the first direction. The second end portions 128b at the intermediate level position may have a length greater than a length of the first end portions 127b at the lower level position, in the first direction.

In one embodiment, the third central portion 129a at the upper level position may have a length less than a length of the second central portion 128a at the intermediate level position, in the first direction. The second central portion 128a at the intermediate level position may have a length less than a length of a first central portion 127a at the lower level position, in the first direction.

Such a structure may result when the impurities are doped. A region doped with the impurities may be formed to be relatively wider in an upper portion than in the lower portion, because the doping profile is not vertical to the top surface of the substrate 100 along the third direction but is to be inclined relative thereto along the third direction. An example will be described with reference to FIG. 18.

In some example embodiments, the first through third end portions 127b, 128b, and 129b of the first through third semiconductor patterns 127, 128, and 129 may serve as a source/drain layer of a transistor together with the fourth semiconductor layer 190. For example, the first through third end portions 127b, 128b, and 129b of the first through third semiconductor patterns 127, 128, and 129 may be extension portions of the source/drain layer which extend from the fourth semiconductor layer 190 in the first direction. The first through third central portions 127a, 128a, and 129a of the first through third semiconductor patterns 127, 128, and 129 may respectively serve as a channel of the transistor. In other words, the transistor may include a plurality of channels or multiple channels that are sequentially stacked on the substrate 100.

In accordance with characteristics of the doping profile, the first through third central portions 127a, 128a, and 129a may have lengths in the first direction (e.g., effective channel lengths or effective gate lengths) that gradually increase in the downward direction. Thus, the first through third central portions 127a, 128a, and 129a of the first through third semiconductor patterns 270, 280, and 290 may respectively have first through third effective gate lengths Le1, Le2, and Le3. The first through third effective gate lengths Le1, Le2, and Le3 may have a greater value in this order. In other words, the first semiconductor pattern 270 may have the first effective gate length Le1 greater than the second effective gate length Le2 of the second semiconductor patterns 280. Also, the second semiconductor pattern 280 may have the second effective gate length Le2 greater than the third effective gate length Le3 of the third semiconductor patterns 290.

The first through third semiconductor patterns 270, 280, and 290 may have first through third thicknesses T1, T2, and T3, respectively, in the third direction. The first through third thicknesses T1, T2, and T3 may change in this order. For example, the first thickness T1 of the first semiconductor pattern 270 may be greater than the second thickness T2 of the second semiconductor patterns 280. Also, the thickness T2 of the second semiconductor pattern 280 may be greater than the third thickness T3 of the third semiconductor patterns 290.

For example, the thicknesses T1, T2 and T3 of the first through third semiconductor patterns 270, 280, and 290 (or thicknesses T1, T2, and T3 of the channels of the first and third semiconductor patterns 270, 280, and 290) may be in a proportional relationship (e.g. a direct proportional relationship) to the effective channel lengths (or the effective gate lengths Le1, Le2, and Le3) of the first and through third semiconductor patterns 270, 280, and 290.

Accordingly, even if the channels in the first through third semiconductor patterns 270, 280, and 290 have effective channel lengths (or effective gate lengths) that increase in the downward direction (as the first through third semiconductor patterns 270, 280, and 290 have thicknesses that increase in the downward direction), a reduction in the current flowing through the channels may be prevented. The reduction in current due to the incremental effective channel lengths (or effective gate lengths) may be offset by the incremental thickness of the channel. Therefore, deviation in current flow among the first through third semiconductor patterns 127, 128, and 129 may be reduced.

The fourth semiconductor layer 190 may be at opposite sides of the first through third semiconductor patterns 127, 128, and 129 and may be connected to the first through third semiconductor patterns 127, 128, and 129. For example, a pair of the fourth semiconductor layers 190 may have the first through third semiconductor patterns 127, 128, and 129 therebetween and may be connected to the first through third semiconductor patterns 127, 128, and 129. In some embodiments, the fourth semiconductor layer 190 may extend in the second direction and an upper portion of the fourth semiconductor layer 190 may contact a sidewall of the gate spacer 160.

The fourth semiconductor layer 190 may include a single crystal silicon carbide or a single crystal silicon doped with n-type impurities. Thus, the fourth semiconductor layer 190 may form a source/drain layer of an NMOS transistor together with the first through third end portions 127b, 128b, and 129b of the first through third semiconductor patterns 127, 128, and 129, which are doped with the n-type impurities.

In one embodiment, the fourth semiconductor layer 190 may include a single crystal silicon-germanium doped with p-type impurities. Thus, the fourth semiconductor layer 190 may form a source/drain layer of a PMOS transistor together with the first through third end portions 127b, 128b, and 129b of the first through third semiconductor patterns 127, 128, and 129, which are doped with the p-type impurities.

In an example, when the fourth semiconductor layer 190 includes a single crystal silicon doped with the n-type impurities, the fourth semiconductor layer 190 may contact the first through third end portions 127b, 128b, and 129b of the first through third semiconductor patterns 127, 128, and 129, which also are doped with the n-type impurities and may be integral with the first through third end portions 127b, 128b, and 129b.

In some embodiments, the fourth semiconductor layer 190 may be an epitaxial layer formed by a selective epitaxial growth (SEG) process, a laser-induced epitaxial growth (LEG) process, or a solid phase epitaxial growth (SPE) process.

The gate structure 250 may enclose the first through third semiconductor patterns 127, 128, and 129. In some embodiments, the gate structure 250 may extend in the second direction and may be formed to include a plurality of gate structures apart from each other in the first direction.

The gate spacer 160 may be formed on opposite sidewalls (e.g., opposite sidewalls disposed in the first direction) of an upper portion of the gate structure 250. The inner spacer 180 may be formed between the fourth layer 190 and a lower portion of the gate structure 250. In some embodiments, the gate spacer 160 may extend in the second direction. In one embodiment, a plurality of inner spacers 180 may be formed along the first and second directions.

The gate structure 250 may include an interface pattern 220, a gate insulating pattern 230, and a gate electrode 240. The interface pattern 220 may be formed on surfaces of the first through third semiconductor patterns 127, 128, and 129 and on the top surface of the substrate 100. The gate insulating pattern 230 may be formed on a surface of the interface pattern 220 and on inner sidewalls of the inner spacer 180 and the gate spacer 160. The gate electrode 240 may extend in the second direction. In some embodiments, a work function control pattern may further be formed between the gate insulating pattern 230 and the gate electrode 240.

The interface pattern 220 may include, for example, an oxide such as silicon oxide. The gate insulating pattern 230 may include, for example, metal oxide having a high dielectric constant such as hafnium oxide ($HfO_2$), tantalum oxide ($Ta_2O_5$) or zirconium oxide ($ZrO_2$). The gate electrode 240 may include, for example, metal such as aluminum (Al), copper (Cu) or tantalum (Ta), and/or nitride thereof. The work function control pattern may include, for example, metal nitride or metal alloy such as titanium nitride (TiN), titanium aluminum (TiAl), titanium aluminum nitride (TiAlN), tantalum nitride (TaN) or tantalum aluminum nitride (TaAlN).

The gate structure 250 may constitute an NMOS transistor or a PMOS transistor together with the source/drain layers.

The insulating layer 200 (refer, e.g., to FIG. 24) may be formed to cover a portion of an upper sidewall of the gate structure 250 and a portion of the fourth semiconductor layer 190. The insulating layer 200 may include, for example, silicon oxide such as tonen silazene (TOSZ).

The metal silicide pattern 290 may be formed on a top surface of the fourth semiconductor pattern 190 and may include, for example, titanium silicide, cobalt silicide or nickel silicide.

The capping layer 260 may be formed on the gate structure 250 and the gate spacer 160 and may include, for example, a nitride such as silicon nitride. The interlayer insulating layer 270 may be formed on the capping layer 260 and may include, for example, silicon oxide such as tetra ethyl ortho silicate (TEOS).

The contact plug 320 may penetrate the interlayer insulating layer 270, the capping layer, and the insulating layer 200 to contact a top surface of the metal silicide pattern 290. In some embodiments, the contact plug 320 may include a metal pattern 310 and a barrier pattern 300, which covers a bottom surface and a side surface of the metal pattern 310. The metal pattern 310 may include, for example, a metal such as tungsten or copper. The barrier pattern 300 may include, for example, metal nitride such as tantalum nitride, titanium nitride, or tungsten nitride. In some embodiments, the contact plug 320 may be self-aligned with the gate spacer 160, but this is not necessary.

The semiconductor device may further include an interconnection line and a contact via which are electrically connected to the contact plug 320.

The semiconductor device as describe above may be a multi-bridge channel field effect transistor (MBCFET) that includes a plurality of channels sequentially stacked on the substrate 100 in the third direction. Although the channels in the first through third semiconductor patterns 127, 128, and 129 may have effective channel lengths (or effective gate lengths) that increase in the downward direction in some embodiments, since the first through third semiconductor patterns 127, 128, and 129 have thicknesses that increase in the downward direction, it is possible to prevent current reduction in the channels. The current reduction caused by the incremental effective channel lengths (or effective gate lengths) may be offset by the incremental thicknesses of the channel, to thereby reduce deviation in current flowing between the channels in the first through third semiconductor patterns 127, 128, and 129. Because at least one of the channels has a relatively greater thickness, carrier mobility therein may be improved.

Figure 5:
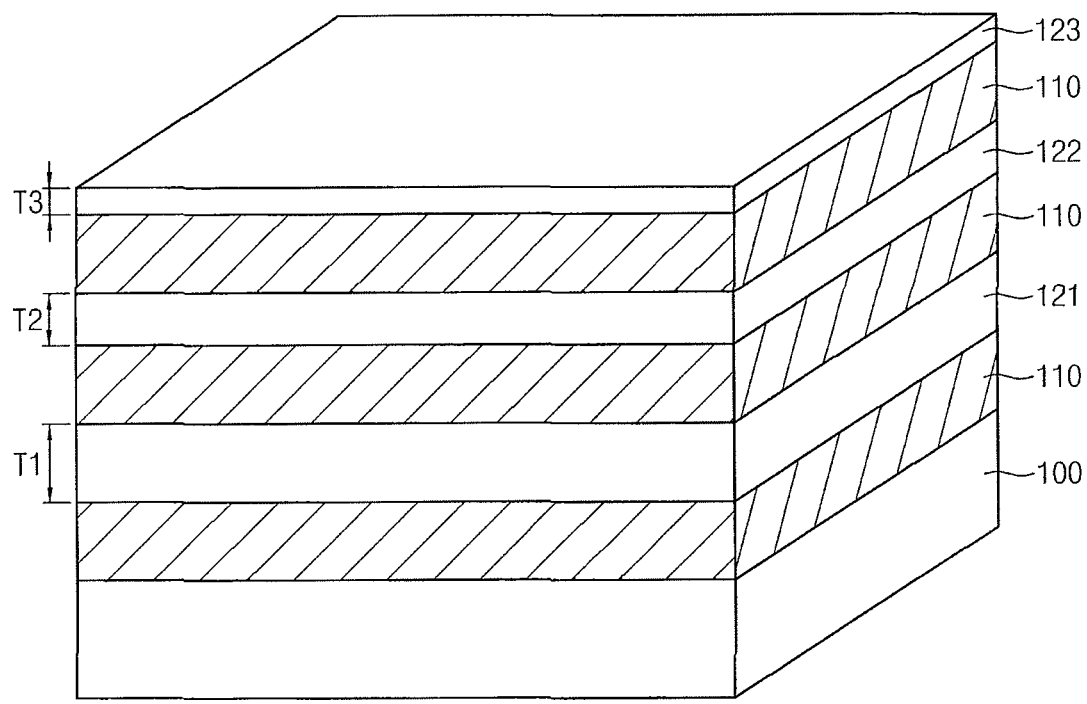
FIGS. 5 through 27 illustrate various stages of an embodiment of a method for fabricating a semiconductor device.
Figure 5:
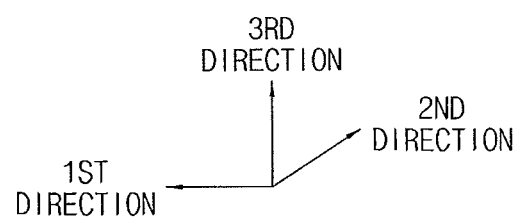

The semiconductor device may include three semiconductor patterns of the first through semiconductor patterns 127, 128, and 129 as describe above. In other embodiments, the semiconductor device may include two semiconductor patterns or four or more semiconductor patterns to form channels FIGS. 5 to 27 illustrate various stages of an embodiment of a method for fabricating a semiconductor device. FIG. 5 illustrates a perspective view. FIGS. 6, 8, 11, 13, 16, 19, 21, 23 and 26 are plan views. FIGS. 7, 9-10, 12, 14-15, 17-18, 20, 22, 24-25 illustrate cross-sectional views. In particular, FIG. 7 illustrates a cross-sectional view taken along line A-A' of a corresponding plan view. FIGS. 9, 12, 14-15, 17-18, 20, 22, 24 and 27 illustrate views taken along line B-B' of corresponding plan views. FIG. 25 illustrates a cross-sectional view along line C-C' of a corresponding plan view.

Referring to FIG. 5, sacrificial layers 110 and semiconductor layers 121, 122, and 123 may be alternately and repeatedly stacked on a substrate 100. The sacrificial layers 110 and the semiconductor layers 121, 122 and 123 are shown as being respectively formed of three layers. In other embodiments, the sacrificial layers 110 and the semiconductor layers 121, 122, and 123 may be respectively formed of another number of layers. The semiconductor layers 121, 122, and 123 are referred to as a first semiconductor layer 121, a second semiconductor layer 122, and a third semiconductor layer 123, which are sequentially from a top surface of the substrate 100 along a third direction perpendicular to the top surface of the substrate 100.

The substrate 100 may include a semiconductor material such silicon, germanium or silicon-germanium or a III-V group compound semiconductor such as GaAs, AlGaAs, InAs, InGaAs, InSb, GaSb, InGaSb, InP, GaP, InGaP, InN, GaN or InGaN. In some embodiments, the substrate 100 may be a silicon-on-insulator (SOI) substrate or a germanium-on-insulator (GOI) substrate.

The sacrificial layer 110 may include a material having an etching selectivity with respect to the substrate 100 and the first through semiconductor layers 121, 122, and 123. In some embodiments, the sacrificial layer 110 may include silicon-germanium.

The first through third semiconductor layers 121, 122, and 123 include a semiconductor material such as silicon or germanium. In some embodiments, the first through third semiconductor layers 121, 122, and 123 may be formed to have first through third thicknesses T1, T2, and T3 in the third direction, respectively. The first through third thicknesses T1, T2, and T3 may change in this order. For example, the first thickness T1 may be greater than the second thickness T2, and the second thickness T2 may be greater than the third thickness T3.

Figure 6:
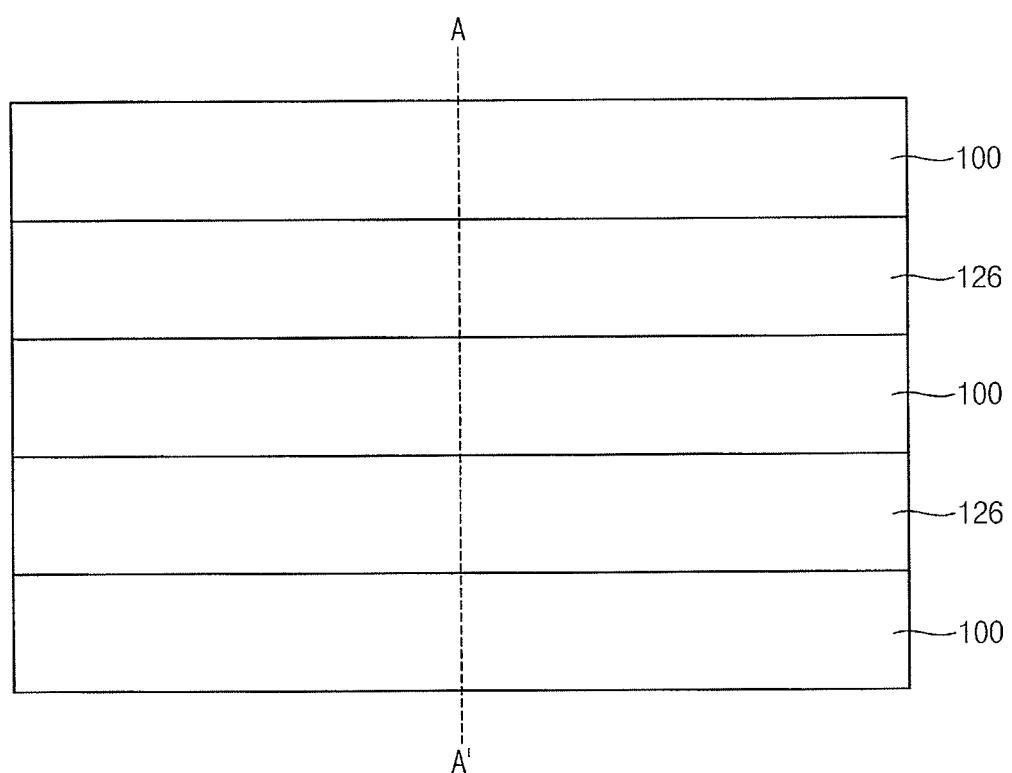
Figure 6:
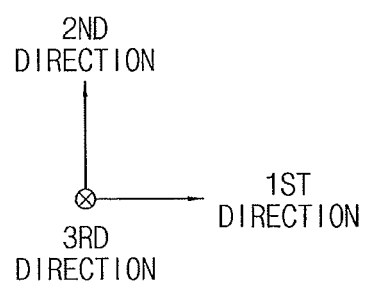
Figure 7:
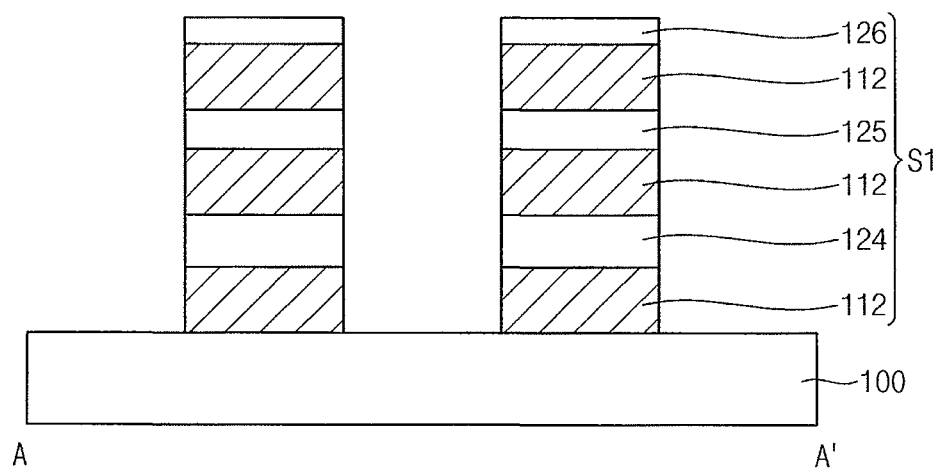
Figure 7:
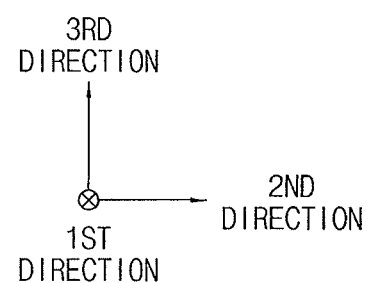

Referring to FIGS. 6 and 7, first etching masks may be formed on the third semiconductor layer 123 at an uppermost level position and may extend in a first direction parallel to the top surface of the substrate 100. Then, the first through third semiconductor patterns 121, 122 and 123 may be etched using the first etching masks. Accordingly, sacrificial lines 112 and first through third semiconductor lines 124, 125, and 126 may be formed on the substrate 100 extending in the first direction.

In some embodiments, the sacrificial lines 112 and the first through third semiconductor lines 124, 125, and 126 may be respectively formed to include a plurality of lines spaced apart from each other in a second direction, parallel to the top surface of the substrate 100 and perpendicular to the first direction. The sacrificial lines 112 and the first through third semiconductor lines 124, 125, and 126, which are stacked on the substrate 100 and extend in the first direction, may be referred to as a first structure S1.

Figure 8:
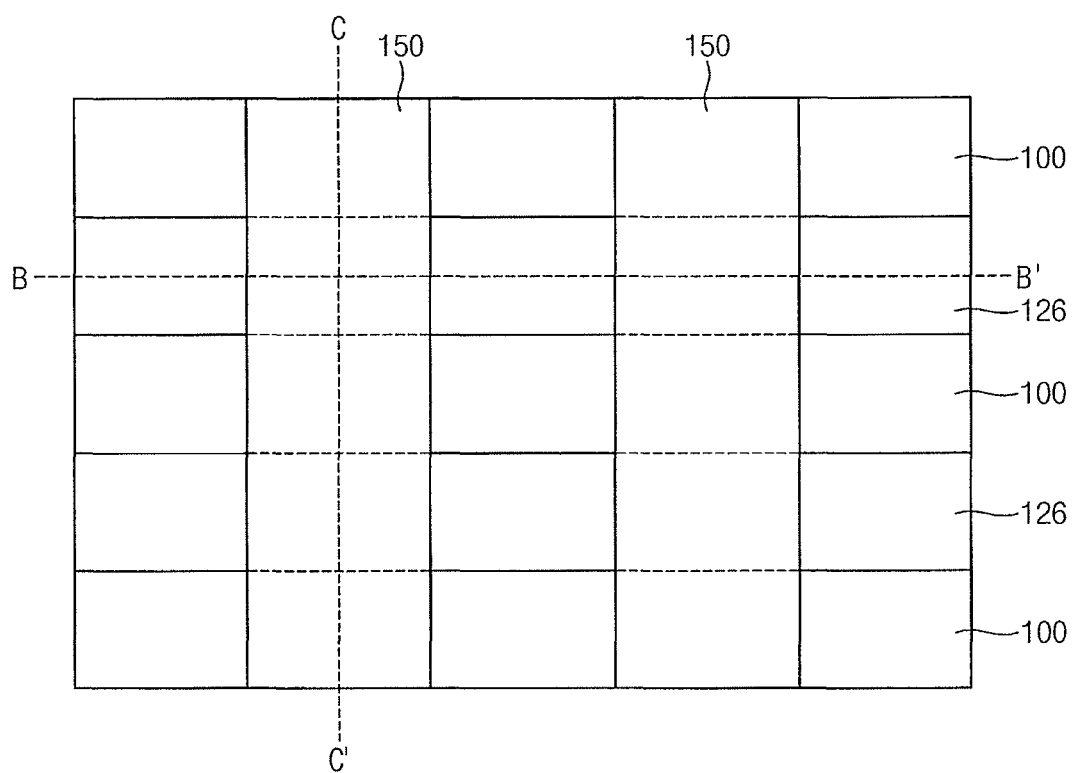
Figure 8:
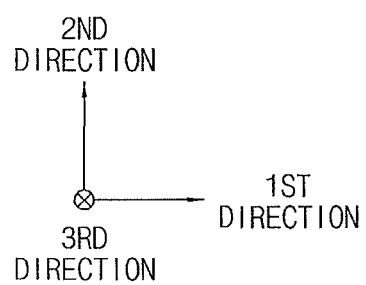
Figure 9:
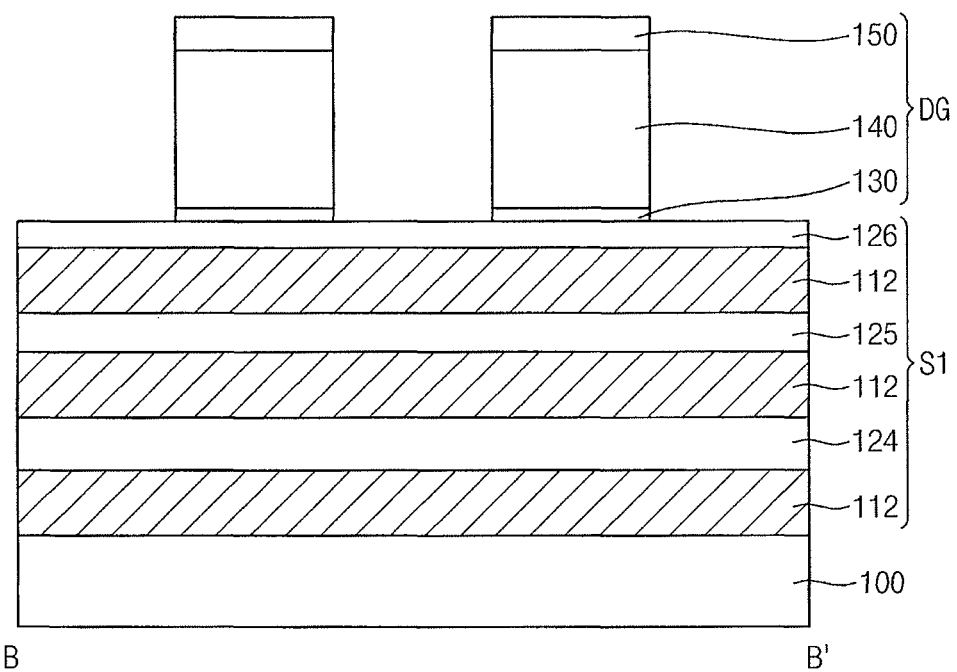
Figure 9:
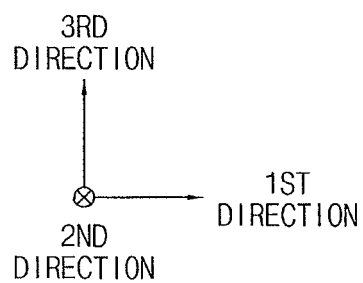
Figure 10:
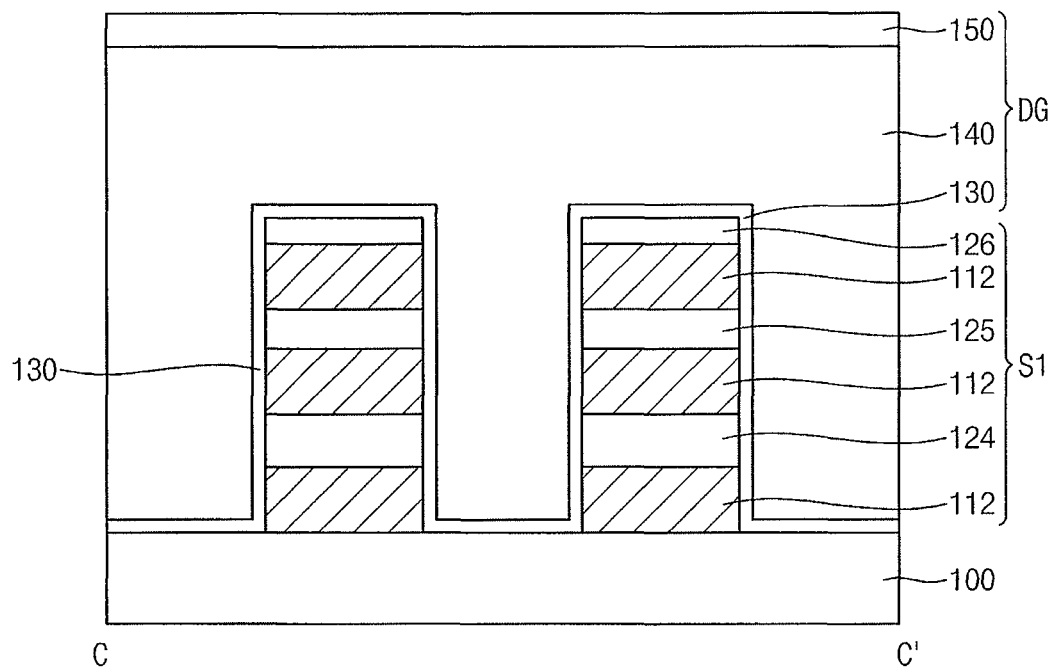
Figure 10:
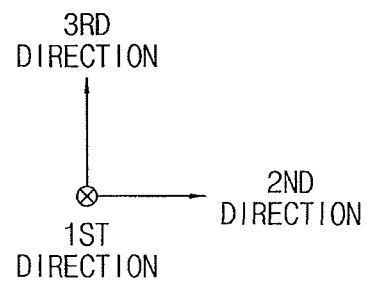

Referring to FIGS. 8 through 10, a dummy gate structure DG may be formed on the first structure S1 and the substrate 100 and may extend in the second direction. For example, a dummy gate insulating layer, a dummy gate electrode layer, and a dummy gate mask layer may be sequentially formed on the substrate 100 on which the first structures S1 are formed. After a photoresist pattern is formed on the dummy gate mask layer, the dummy gate mask layer may be etched using the photoresist pattern as an etching mask to form a dummy gate mask 150. The dummy gate electrode layer and the dummy gate insulating layer may be etched using the dummy gate mask 150 as an etching mask to form a dummy gate electrode 140 and a dummy gate insulating pattern 130. Thus, the dummy gate insulating pattern 130, the dummy gate electrode 140 and the dummy gate mask 150 that are sequentially stacked may constitute the dummy gate structure DG.

In some embodiments, the dummy gate structure DG may be formed to include a plurality of dummy gate structures spaced apart from each other in the first direction and extending in the second direction.

The dummy gate insulating layer may be formed, for example, of an oxide such as silicon oxide. The dummy gate electrode layer may be formed, for example, of poly-silicon. The dummy gate mask layer may be formed, for example, of a nitride such as silicon nitride. The dummy gate insulating layer may be formed, for example, by a chemical vapor deposition (CVD) process or an atomic layer deposition (ALD) process. In another embodiment, the dummy gate insulating layer may be formed by a thermal oxidation process. The dummy gate electrode layer and the dummy gate mask layer may be formed, for example, by a chemical vapor deposition (CVD) process or an atomic layer deposition (ALD) process.

Figure 11:
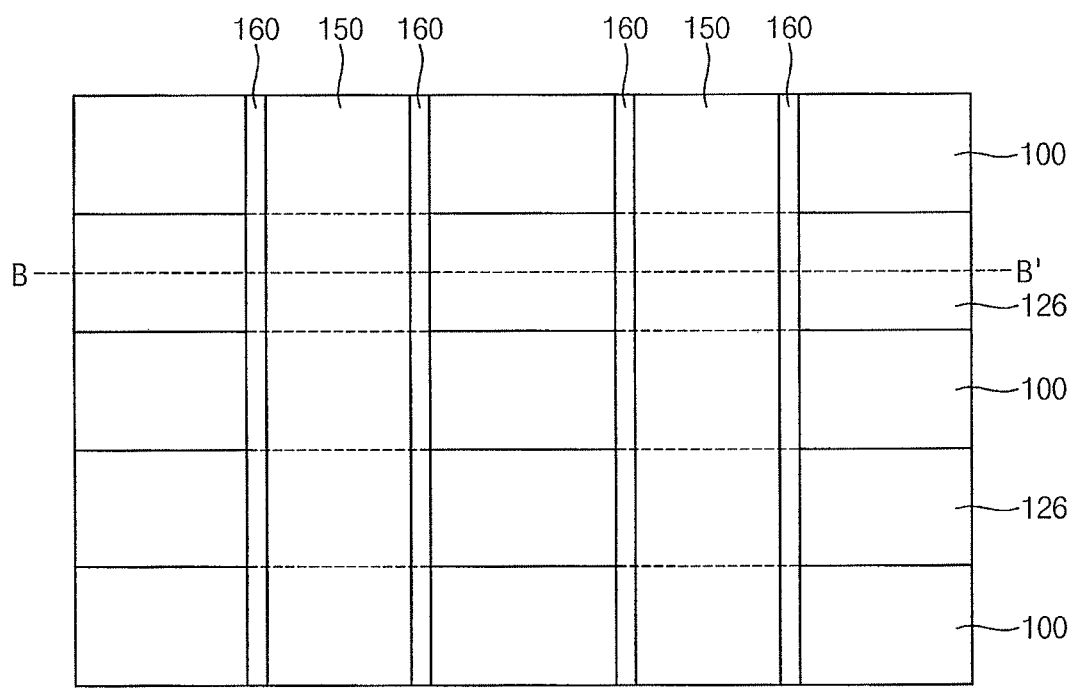
Figure 11:
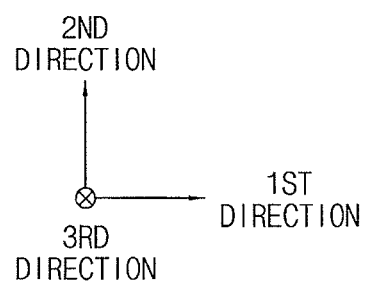
Figure 12:
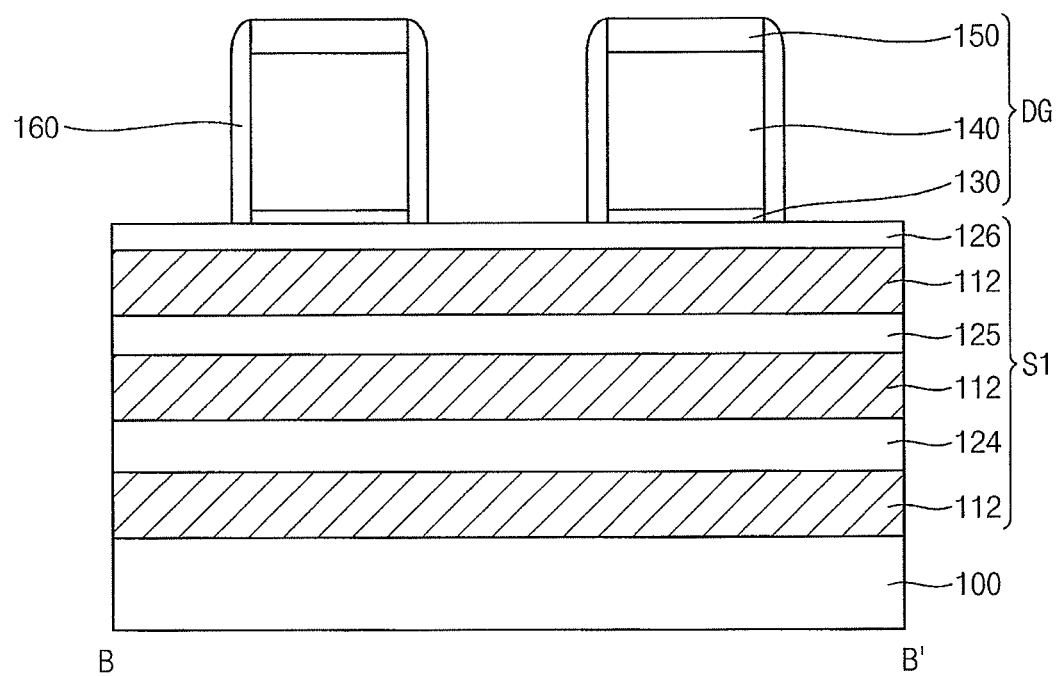

Referring to FIGS. 11 and 12, a gate spacer 160 may be formed on a sidewall of the dummy gate structure DG. For example, after a gate spacer layer is formed on the substrate 100 on which the first structure S1 and the dummy gate structure DG are formed, the gate spacer layer may be anisotropically etched to form the gate spacer 160 on opposite sidewalls of the dummy gate structure DG in the first direction. The gate spacer layer may be formed, for example, of a nitride such as silicon nitride.

Figure 13:
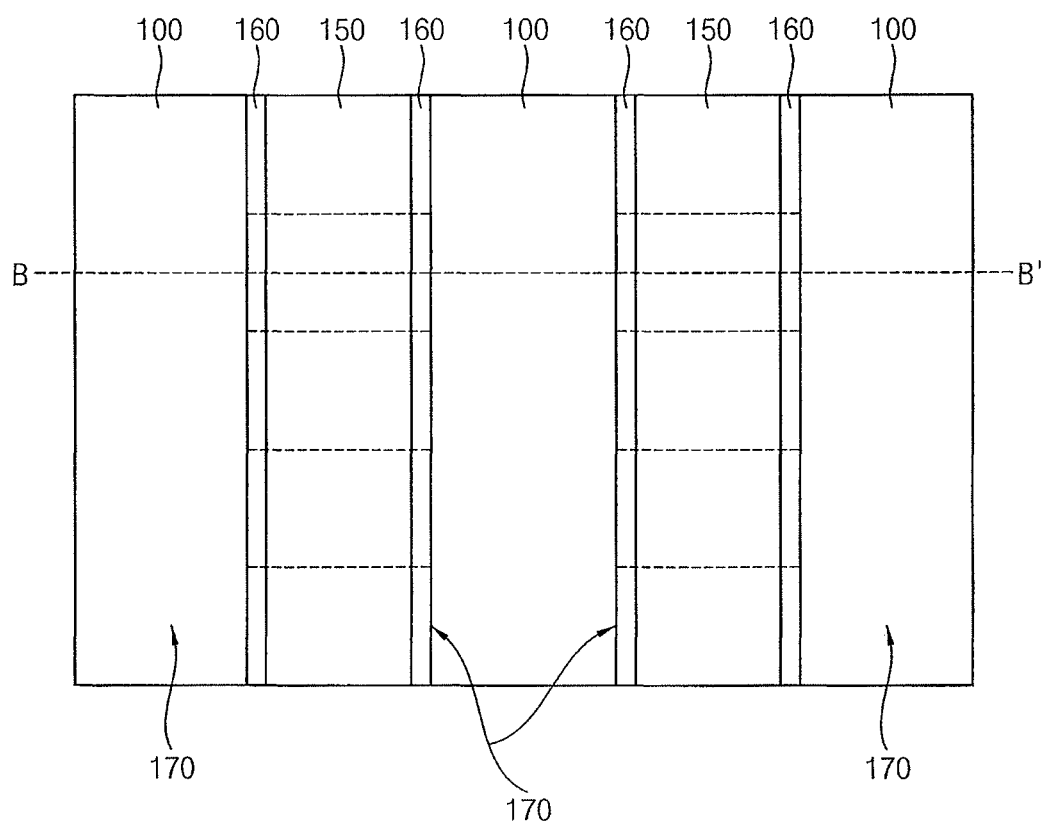
Figure 14:
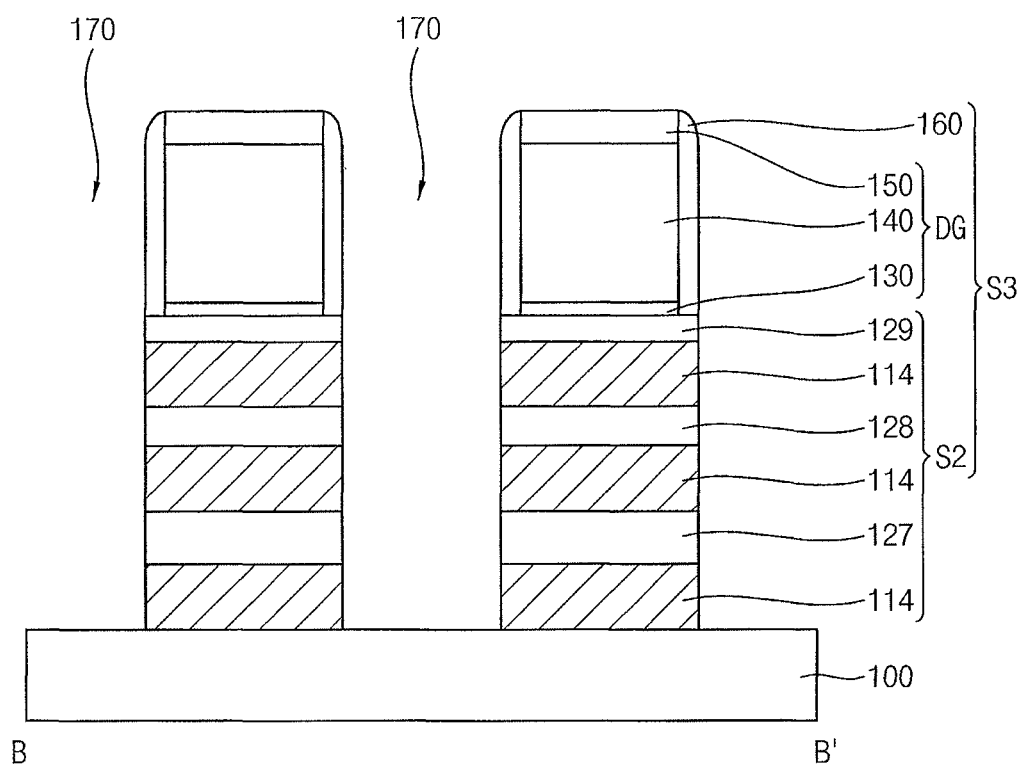
Figure 14:
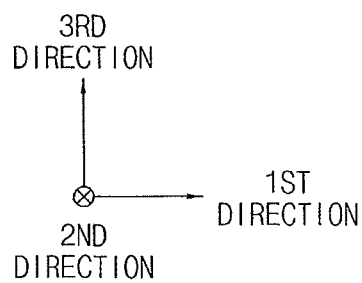
Figure 15:
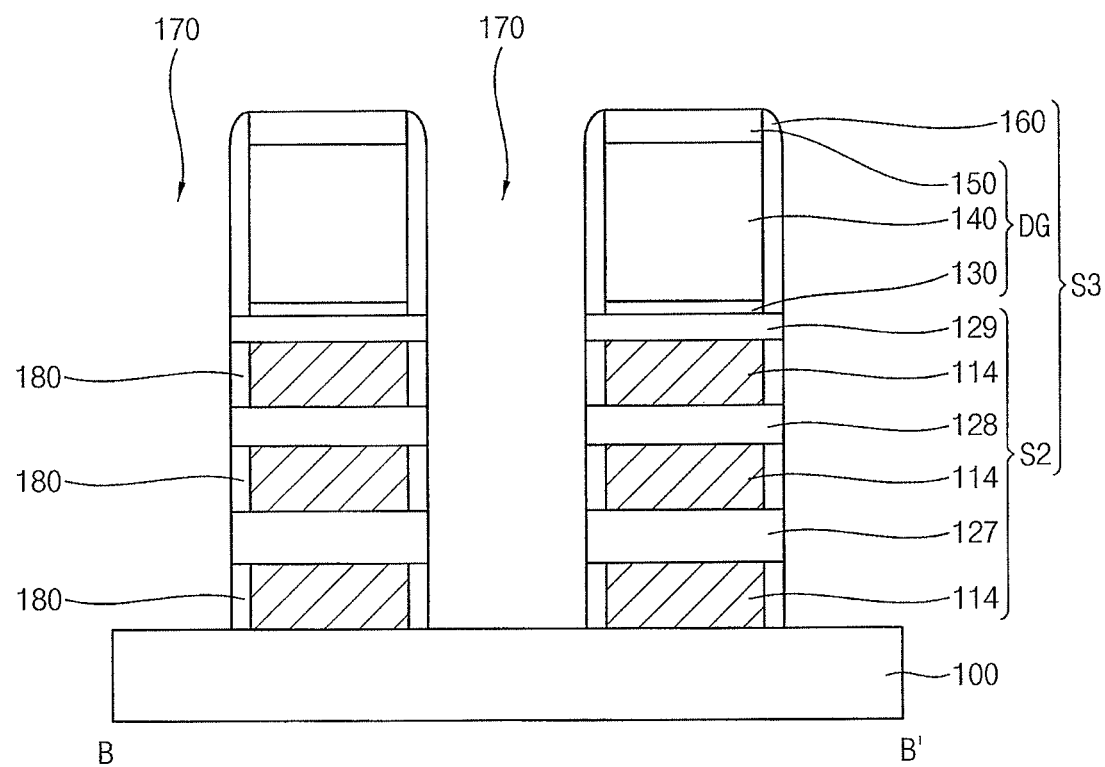
Figure 15:
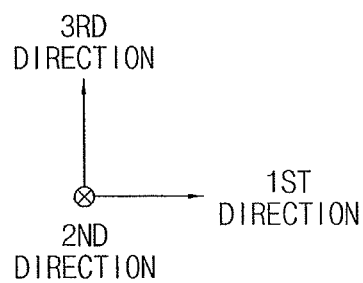

Referring to FIGS. 13 and 14, the first structure S1 under the dummy gate structure DG and the gate spacer 160 may be etched, using the dummy gate structure DG and the gate spacer 160 as an etching mask, to form a second structure S2 between the substrate 100 and the dummy gate structure DG. The second structure S2 may include sacrificial patterns 114 and semiconductor patterns 127, 128, and 129, which are alternately stacked on the substrate 100. A plurality of second structures S2 may be formed to be spaced apart from each other in the first and second directions. For example, the single first structure S1 that extends in the first direction may be patterned to form the plurality of the second structures S2 spaced apart from each other in the first direction. Furthermore, as the first structure S1 is formed in the plurality of first structures in the second direction, the second structure S2 may be formed in the plurality of second structures that are spaced apart from each other in the second direction.

The semiconductor patterns 127, 128, and 129 may be referred to as a first semiconductor pattern 127, a second semiconductor pattern 128, and a third semiconductor pattern 129 sequentially from the top surface of the substrate 100 in the third direction. In some embodiments, each of the first through third semiconductor patterns 127, 128, and 129 may be a nanosheet. In other embodiments, each of the first through third semiconductor patterns 127, 128 and 129 may be a nanowire.

The dummy gate structure DG extending in the second direction, the gate spacer 160 formed on the opposite sidewalls of the dummy gate structure DG, and the second structure S2 may be referred to as a third structure S3. In some embodiments, the third structure S3 may extend in the second direction and may be formed to include a plurality of third structures spaced apart from each other in the first direction. A first opening 170 may be formed between the plurality of third structure S3 that are spaced apart from each other in the first direction Referring to FIG. 15, opposite sidewalls (e.g., sidewalls in the first direction) of each of the sacrificial patterns 114 adjacent to the first opening 170 may be etched to form recesses. Then, an inner spacer 180 may be formed to fill the recesses. In some embodiments, the recesses may be formed by performing a wet etching process on the sacrificial patterns 114. The inner spacer 180 may be formed, for example, by a deposition process such as a CVD process or an ALD process and may be formed of a an oxide such as silicon oxide.

The inner spacer 180 may be formed to have a thickness in the first direction substantially equal to a thickness of the gate spacer 160 in the first direction. In other embodiments, the inner spacer 180 may be formed to have a thickness in the first direction greater or less than a thickness of the gate spacer 160 in the first direction.

Figure 16:
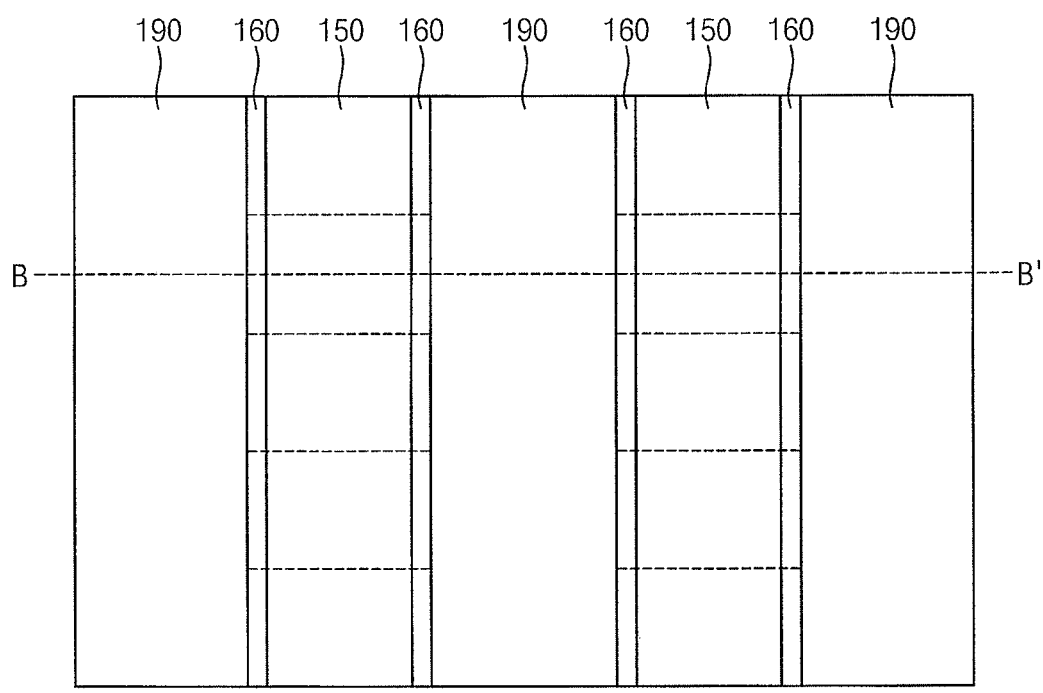
Figure 16:
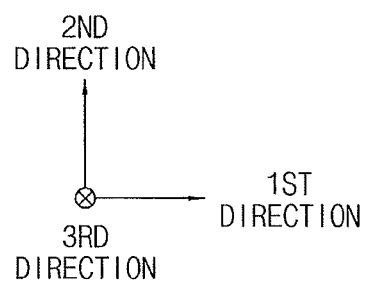
Figure 17:
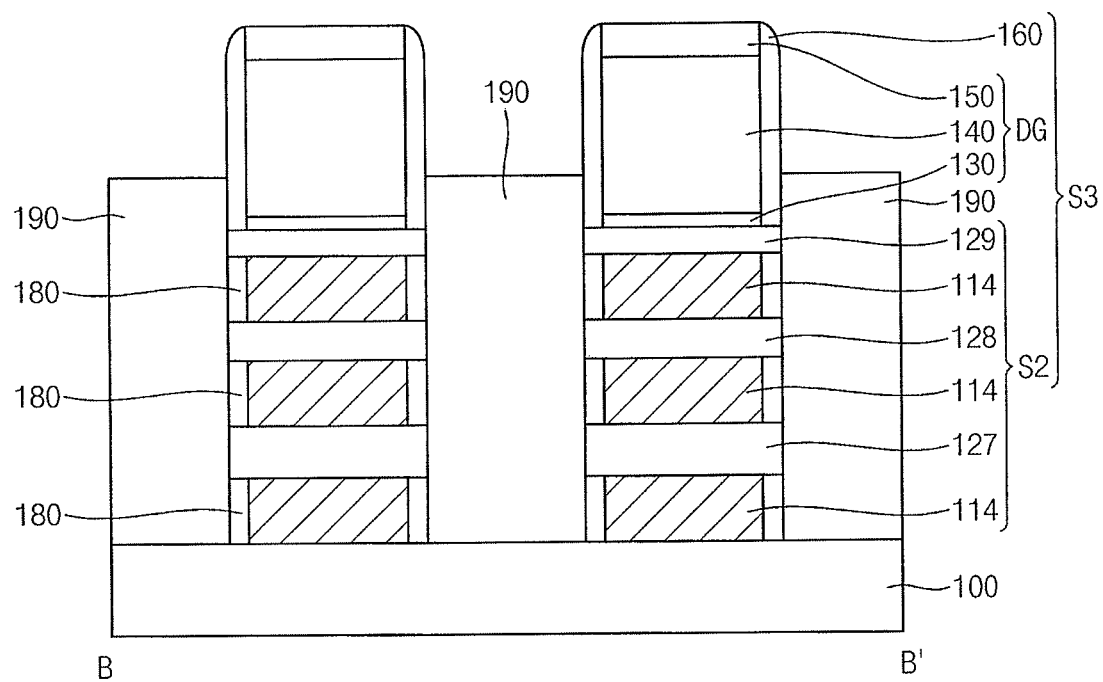
Figure 17:
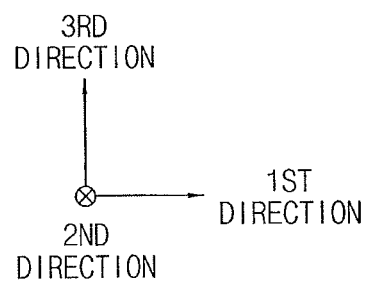

Referring to FIGS. 16 and 17, a fourth semiconductor layer 190 may be formed on the top surface of the substrate 100 exposed by the first opening 170. In some embodiments, the fourth semiconductor layer 190 may be formed by performing a selective epitaxial growth (SEG) process using the exposed top surface of the substrate 100 as a seed.

For example, the SEG process may be performed using a silicon source gas such as disilane ($Si_2H_6$) and a carbon source gas such as $SiH_3CH_3$, to thereby form a single crystal silicon carbide (SiC) layer. In one embodiment, the SEG process may be performed using only the silicon source gas such as disilane ($Si_2H_6$), to thereby form a single crystal silicon layer. In addition, a doping process using an n-type impurity source gas, for example, phosphine (PH3), may be performed in-situ to form the single crystal silicon carbide layer or single crystal silicon layer doped with n-type impurities.

In some embodiments, the SEG process may be performed, using a silicon source gas such as dichlorosilane ($SiH_2Cl_2$) and a germanium source gas such as germane ($GeH_4$), to form a single crystal silicon germanium (SiGe) layer. In addition, a doping process using a p-type impurity source gas, for example, diborane ($B_2H_6$), may be performed in-situ to form the single crystal silicon germanium (SiGe) layer doped with the p-type impurities.

In some embodiments, the fourth semiconductor layer 190 may be formed at opposite sides of the third structure S3 in the first direction (e.g., a pair of the fourth semiconductor layers 190 may be formed to have the third structure S3 therebetween) and may extend in the second direction. The fourth semiconductor layer 190 may contact sidewalls of the second structure S2 and may further extend in the third direction to contact sidewalls of the gate spacer 160 on the second structure S2.

When the fourth semiconductor layer 190 includes the single crystal silicon, the fourth semiconductor layer 190 may contact sidewalls of the first through third semiconductor patterns 127, 128, and 129 including silicon, such that the fourth semiconductor layer 190 is integral with the first through third semiconductor patterns 127, 128, and 129. The fourth semiconductor layer 190 may include, for example, an epitaxial layer formed by the SEG process described above. The epitaxial layer may be formed, for example, by an LEG process or SPE process.

Figure 18:
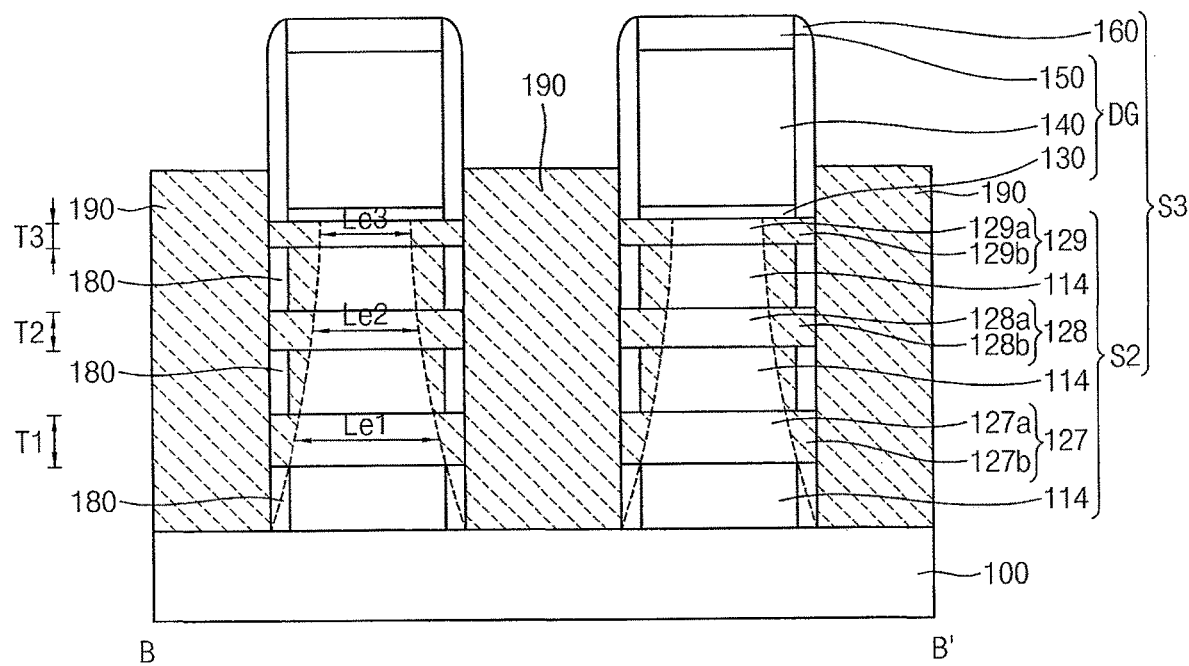

Referring to FIG. 18, the fourth semiconductor layer 190 may be doped with impurities and may be annealed, to thereby form a source/drain layer. When the fourth semiconductor layer 190 is formed, for example, of silicon carbide or silicon, n-type impurities may be doped into the fourth semiconductor layer 190 and annealed to form a source/drain layer of the NMOS transistor. When the fourth semiconductor layer 190 is formed, for example, of silicon germanium, p-type impurities may be doped into the fourth semiconductor layer 190 and annealed to form a source/drain layer of the PMOS transistor.

When the impurities are doped in the fourth semiconductor layer 190, the impurities may also be doped in opposite end portions of the first through third semiconductor patterns 127, 128, and 129 in the first direction (e.g., first through third end portions 127b, 128b, and 129b of the first through third semiconductor patterns 127, 128, and 129) and portions of the sacrificial patterns 114 besides the fourth semiconductor layer 190. The source/drain layer may therefore be formed to include the fourth semiconductor layer 190 and the first through third end portions 127b, 128b, and 129b of the first through third semiconductor patterns 127, 128, and 129.

In some embodiments, the first through third end portions 127b, 128b, and 129b may have lengths in the first direction which gradually decrease in a downward direction (e.g., a direction from an upper level position toward a lower level position). For example, the first end portions 127b may have a length in the first direction greater than a length of the second end portions 128b in the first direction. Also, the second end portions 128b may have the length in the first direction greater than a length of the third end portions 129b in the first direction.

Thus, according to characteristics of the doping process, an impurity doped region may include a larger upper portion than a lower portion thereof. As a result, an impurity doping profile may not be vertical to the top surface of the substrate 100 along the third direction, but rather may be inclined relative to the top surface of the substrate 100 along the third direction.

First through third central portions 127a, 128a and 129a of the first through third semiconductor patterns 127, 128, and 129 may respectively act as a channel of the transistor. In other words, the transistor may include a plurality of channels or multiple channels sequentially stacked on the substrate 100. In some embodiments, according to the characteristics of the doping process as described above, first through third central portions 127a, 128a, and 129a may have lengths in the first direction (e.g., effective channel lengths or effective gate lengths) which gradually increase in the downward direction. Accordingly, the first through third central portions 127a, 128a, and 129a of the first through third semiconductor patterns 127, 128, and 129 may respectively have first through third effective gate lengths Le1, Le2, and Le3. The first through third central portions 127a, 128a, and 129a may have values in a predetermined order, e.g., Le1>Le2>Le3.

The first through third semiconductor patterns 127, 128, and 129 may have thicknesses in the third direction which gradually increase in the downward direction Thus, the same or similar amount of current may flow through the respective channels in the first through third semiconductor patterns 127, 128, and 129. For example, because the channels formed in the first through third patterns 127, 128, and 129 have effective channel lengths (or effective gate lengths) that increase in the downward direction, current flowing through the channels may be reduced. However, since the first through third semiconductor patterns 127, 128, and 129 have thicknesses that increase in the downward direction, current reduction may be offset.

Figure 19:
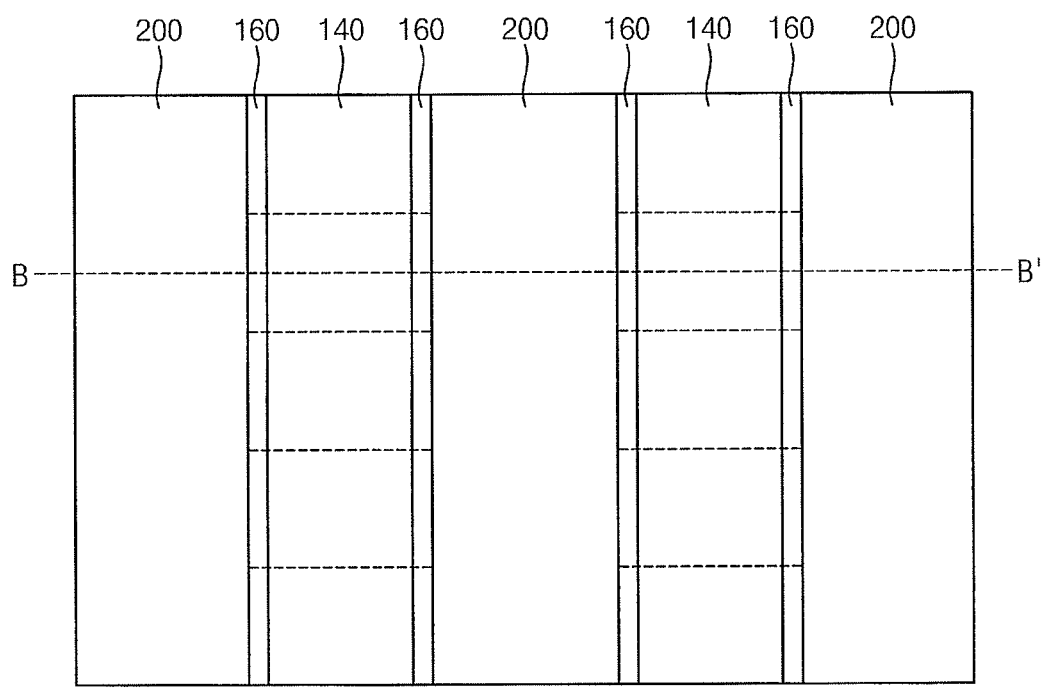
Figure 19:
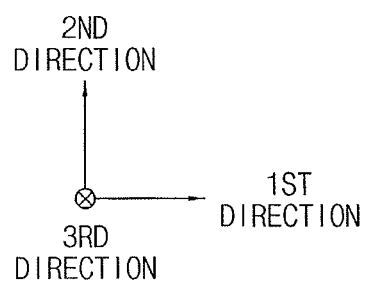
Figure 20:
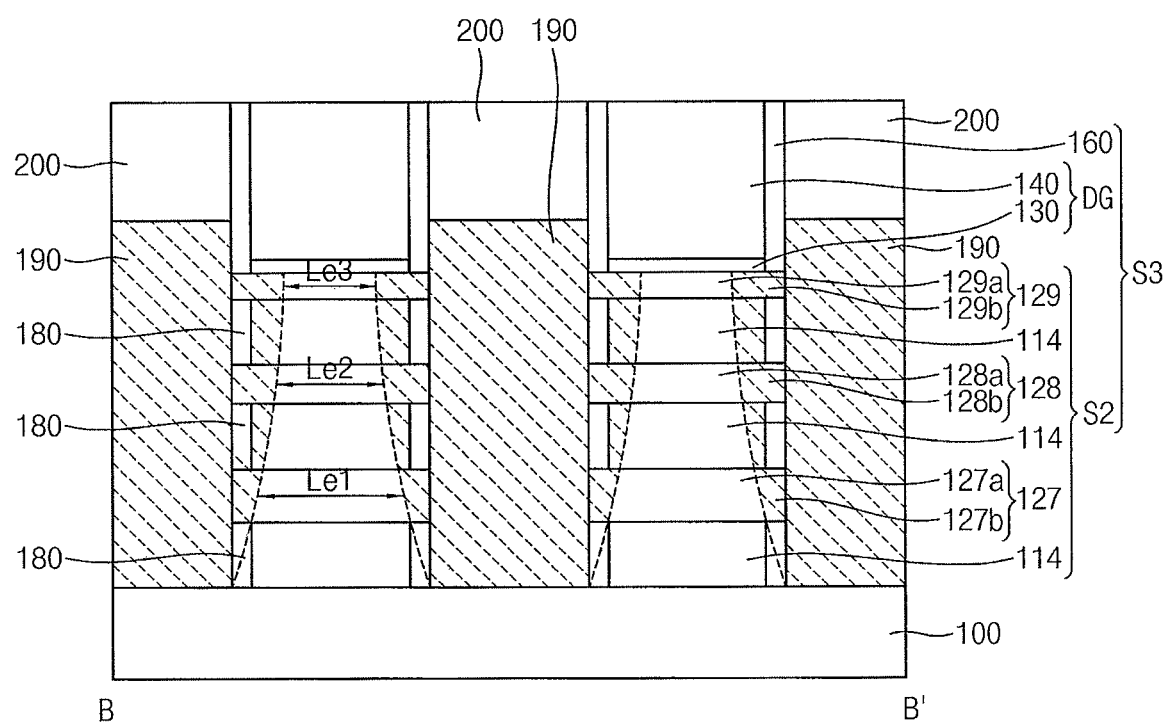
Figure 20:
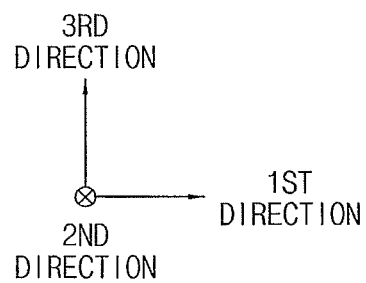

Referring to FIGS. 19 and 20, after forming an insulating layer 200 thick enough to cover the third structure S3 and the fourth semiconductor layer 190, the insulating layer 200 may be planarized to expose top surfaces of the dummy gate electrodes 140 in the third structure S3. At this time, the dummy gate mask 150 may be removed together and upper portions of the gate spacers 160 may be partially removed. The insulating layer 200 may be formed, for example, of silicon oxide such as tonen silazene (TOSZ). The planarization process may be performed, for example, by a chemical mechanical polishing (CMP) process and/or an etch-back process.

Figure 21:
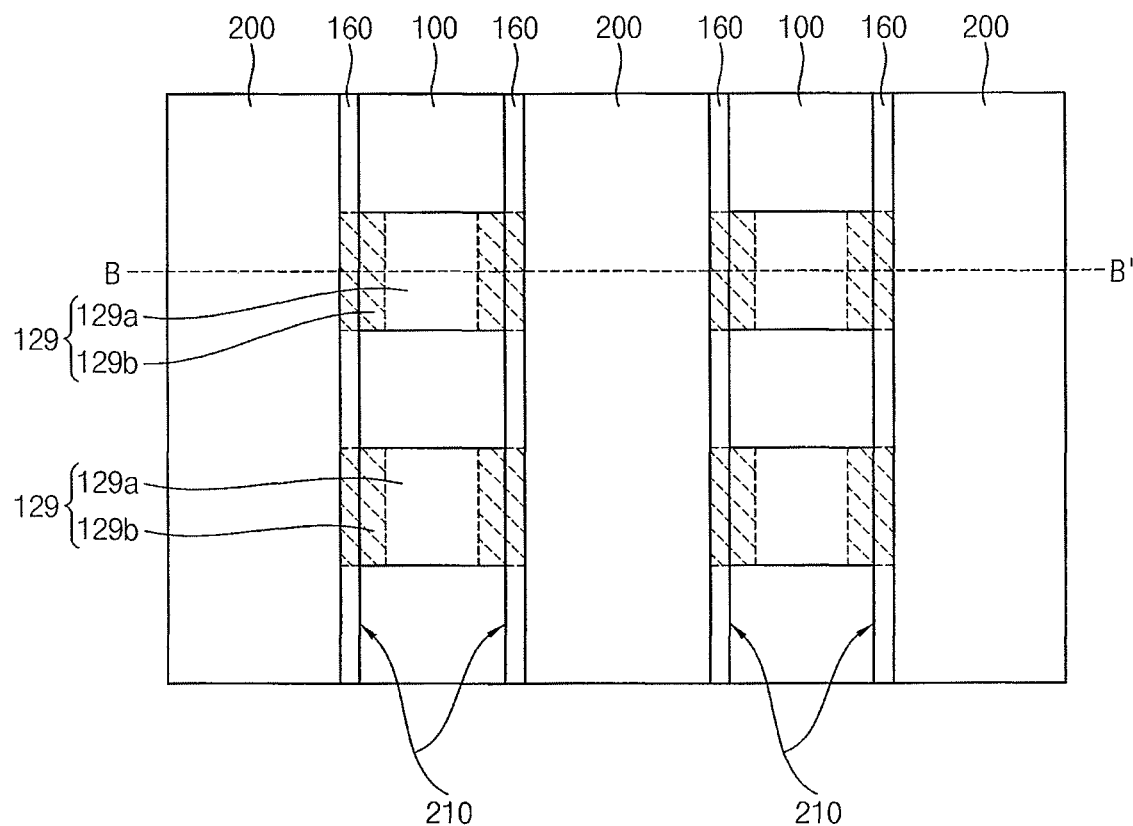
Figure 22:
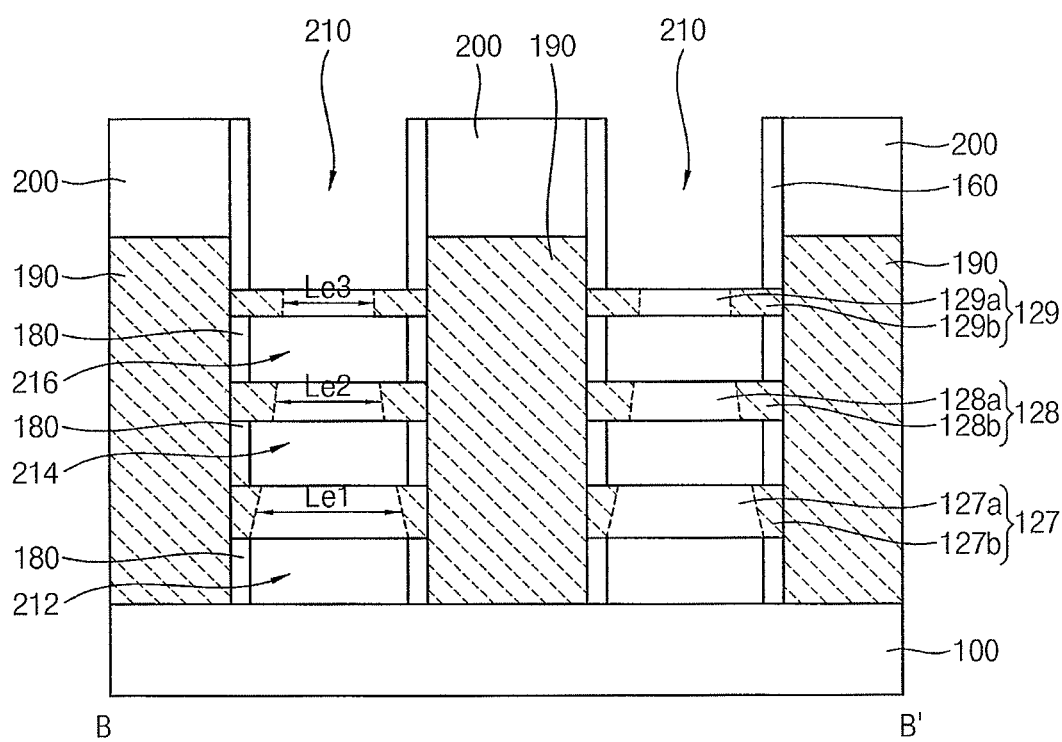
Figure 22:
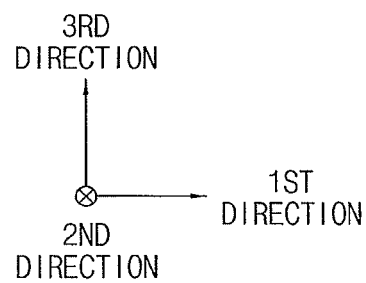

Referring to FIGS. 21 and 22, the exposed dummy gate electrode 140, the dummy gate insulating pattern 130, and the sacrificial patterns 114 may be removed such that second through fifth openings 210, 212, 214, and 216 are formed to expose inner sidewalls of the gate spacer 160, inner sidewalls of the inner spacer 180, surfaces of the first through third semiconductor patterns 127, 128, and 129, and top surface of the substrate 100. In some embodiments, the second through fifth openings 210, 212, 214, and 216 may be formed to extend in the second direction.

An opening that exposes the inner sidewalls of the gate spacer 160 and a top surface of the third semiconductor pattern 129 may be defined as the second opening 210. An opening that exposes the inner sidewalls of the inner spacer 180, the top surface of the substrate 100, and a bottom surface of the first semiconductor pattern 127 may be defined as the third opening 212. An opening that exposes the inner sidewalls of the inner spacer 180, a top surface of the first semiconductor pattern 127, and a bottom surface of the second semiconductor pattern 128 may be defined as the fourth opening 214. An opening that exposes the inner sidewalls of the inner spacer 180, a top surface of the second semiconductor pattern 128 and a bottom surface of the third semiconductor pattern 129 may be defined as the fifth opening.

Figure 23:
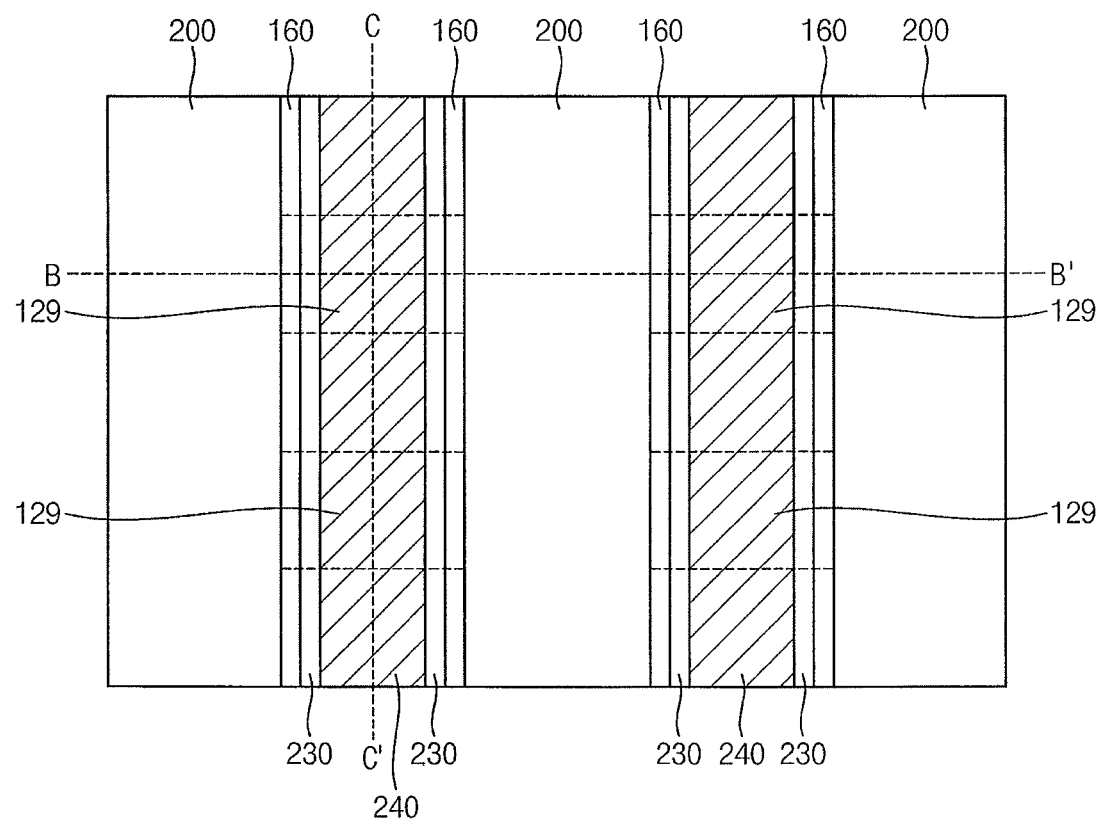
Figure 23:
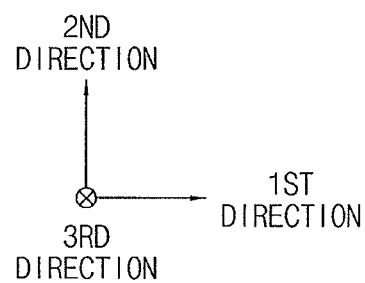
Figure 24:
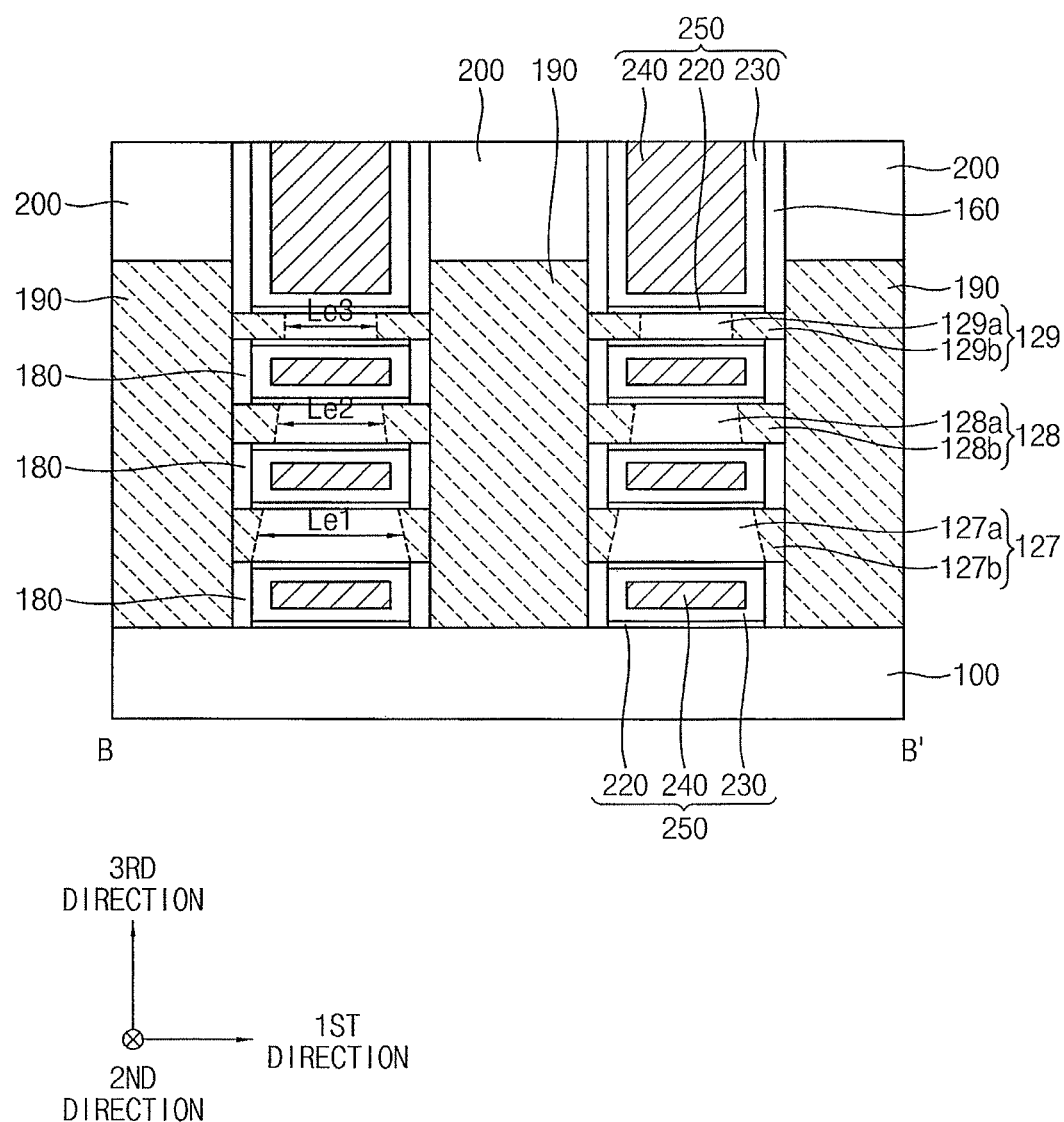
Figure 25:
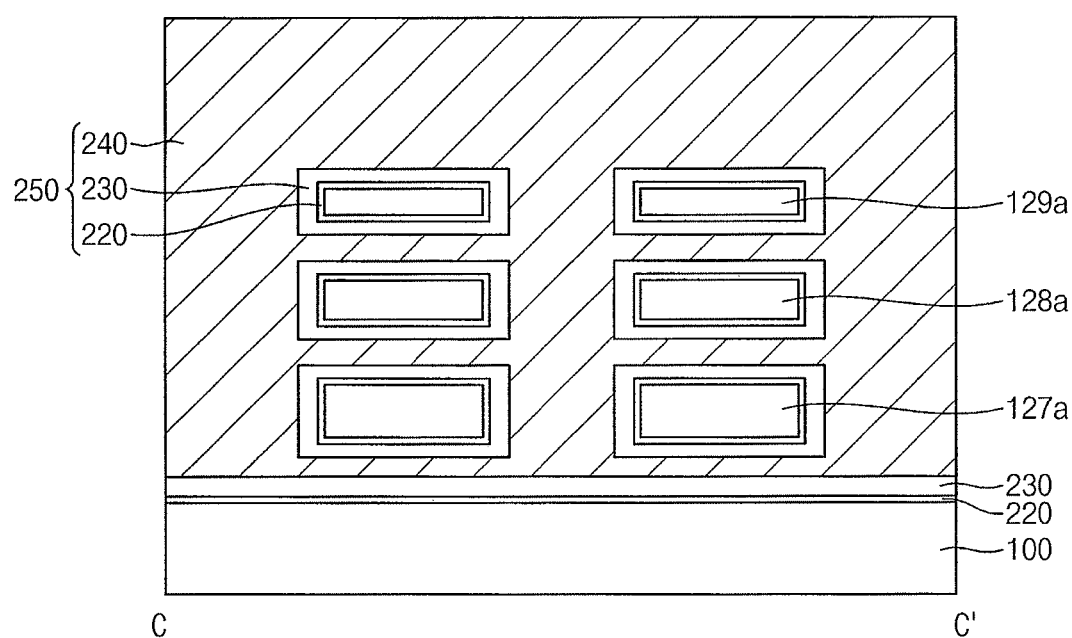
Figure 25:
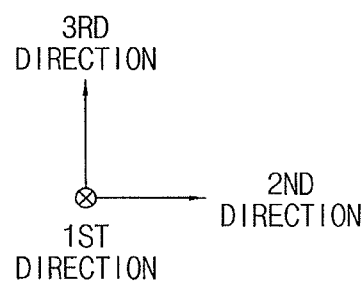

Referring to FIGS. 23 through 25, a gate structure 250 may be formed on the substrate 100 and may fill the second through fifth openings 210, 212, 214, and 216. Specifically, after a thermal oxidation process is performed on the top surface of the substrate 100 and the surfaces of the first through third semiconductor patterns 127, 128, and 129 so as to form an interface pattern 220, a gate insulating layer may be formed on a surface of the interface pattern 220, on the inner sidewalls of the inner spacer 180, on the inner sidewalls of the gate spacer 160, and on a top surface of the insulating layer 200. A gate electrode layer may be formed on the gate insulating layer to fill remaining portions of the second through fifth openings 210, 212, 214, and 216.

The interface pattern 220 may be formed of, for example, an oxide such as silicon oxide, the gate insulating layer may be formed, for example, of metal oxide having a high-k dielectric constant, such as hafnium oxide (HfO$_2$), tantalum oxide (Ta$_2$O$_5$) or zirconium oxide (ZrO$_2$) using a CVD process or an ALD process. The gate electrode layer may be formed, for example, of a metal such as aluminum (Al), copper (Cu) or tantalum (Ta), and/or a nitride thereof. The gate electrode layer may be formed using, for example, a CVD process, an ALD process, or a physical vapor deposition (PVD) process. After forming the gate electrode layer, an annealing process such as a rapid thermal annealing (RTA) process, a spike RTA process, a flash RTA process, or a laser annealing process may be conducted.

In some embodiments, the interface pattern 220 may be formed by a CVD process or an ALD process instead of the thermal oxidation process. In this case, the interface pattern 220 may be formed on the inner sidewalls of the inner spacer 180 and the gate spacer 160, on the top surface of the substrate 100, and on the surfaces of the first through third semiconductor patterns 127, 128 and 129.

In addition, a work function control layer may be formed before forming the gate electrode layer on the gate insulating layer. The work function control layer may be formed, for example, of metal nitride or metal alloy such as titanium nitride (TiN), titanium aluminum (TiAl), titanium aluminum nitride (TiAlN), tantalum nitride (TaN), or tantalum aluminum nitride (TaAlN).

The gate electrode layer and the gate insulating layer may be planarized to expose the top surface of the insulating layer 200 and to thereby form a gate electrode 240 and a gate insulating pattern 230 are formed.

The interface pattern 220, the gate insulating pattern 230, and the gate electrode 240 may constitute a gate structure 250. The gate structure 250 may form an NMOS transistor or a PMOS transistor together with the source/drain layers. In some embodiments, the gate structure 250 may extend in the second direction and may be formed to include a plurality of the gate structures spaced apart from each other in the first direction.

Figure 26:
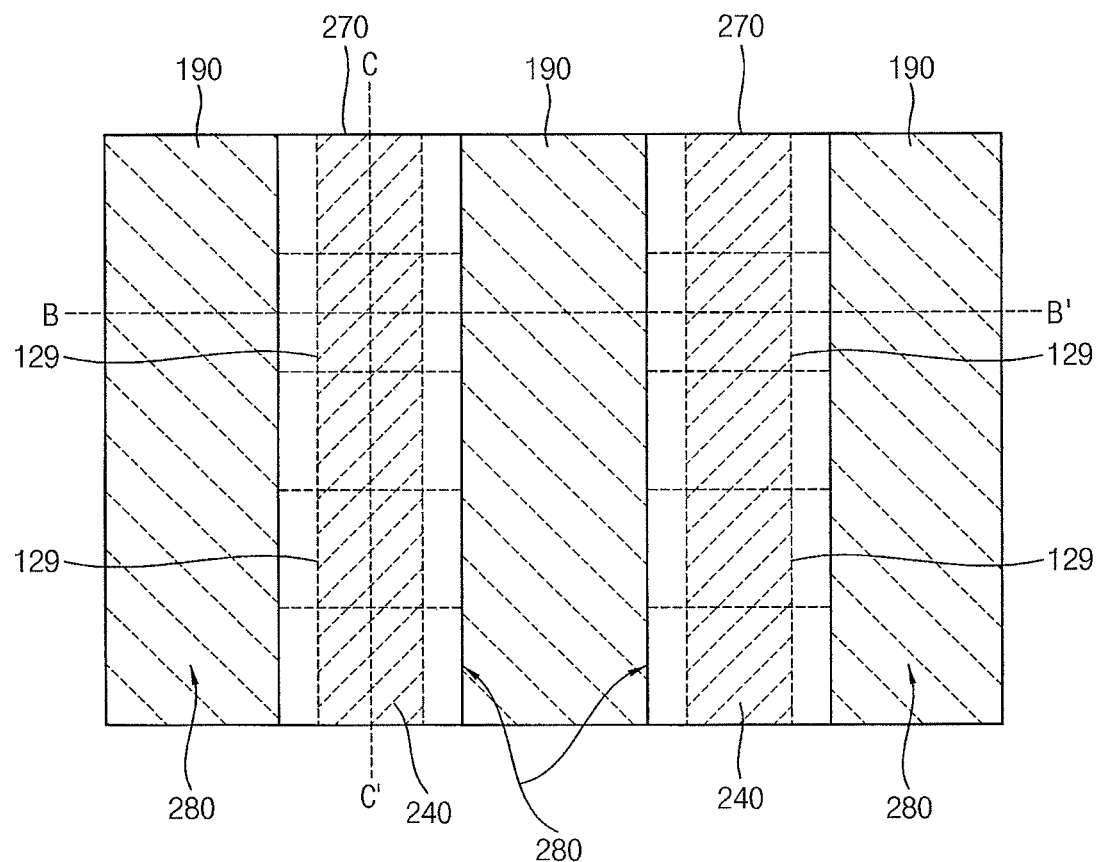
Figure 26:
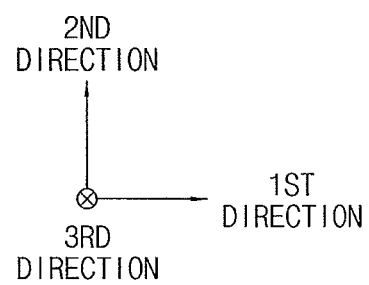
Figure 27:
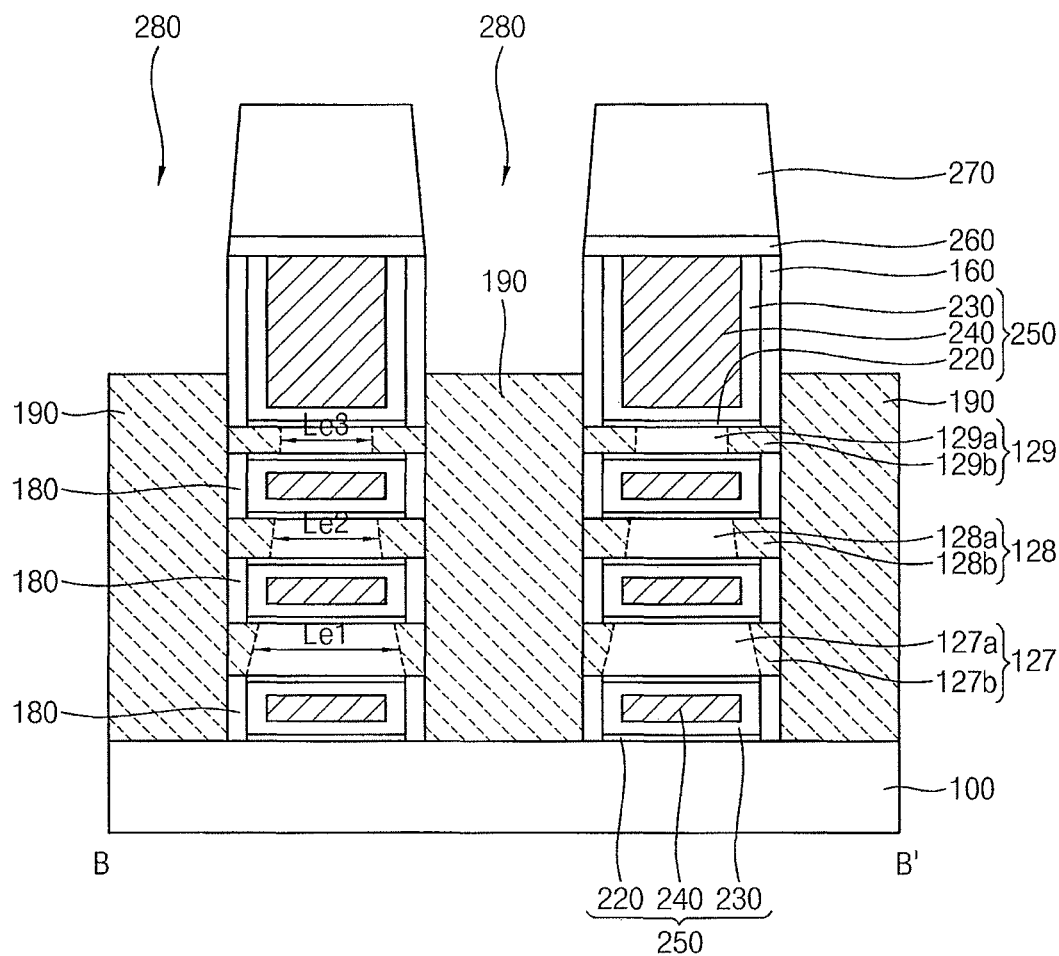

Referring to FIGS. 26 and 27, a capping layer 260 and an interlayer insulating layer 270 may be sequentially formed on the insulating layer 200, the gate structure 250, and the gate spacer 160. A contact hole 280 may be formed to penetrate the insulating layer 200, the capping layer 260, and the interlayer insulating layer 270 and to expose a top surface of the fourth semiconductor layer 190. In some embodiments, after forming the contact hole 280, a portion the insulating layer 200 may remain on the fourth semiconductor layer 190 that covers a portion of the gate spacer 160 and a portion of the fourth semiconductor layer 190. The capping layer 260 may be formed, for example, silicon oxide such as tetra ethyl ortho silicate (TEOS).

Referring again to FIGS. 1 through 4, a first metal layer may be formed on the exposed top surface of the fourth semiconductor layer 190, a sidewall of the contact hole, and a top surface of the interlayer insulating layer 270. An annealing process may be conducted to form a metal silicide pattern 290. The first metal layer may be formed, for example, of a metal such as titanium, cobalt or nickel.

A barrier layer may be formed on a top surface of the metal silicide pattern 290, the sidewall of the contact hole 280, and the top surface of the interlayer insulating layer 270. A second metal layer that fills the contact hole 280 may be formed on the barrier layer. The second metal layer and the barrier layer may be planarized to expose the top surface of the interlayer insulating layer 270. Thus, a contact plug 320 that fills the contact hole 280 may be formed on the metal silicide pattern 290. In some embodiments, the contact plug 320 may be formed to be self-aligned with the gate spacer 160.

The barrier layer may be formed, for example, of metal nitride such as tantalum nitride, titanium nitride or tungsten nitride. The second metal layer may be formed, for example, of a metal such as tungsten or copper.

The contact plug 320 may include a metal pattern 310 and a barrier pattern 300, that covers a bottom surface and a side surface of the metal pattern 310. An interconnection line and a via contact may be formed to be electrically connected to the contact plug 320.

Figure 28:
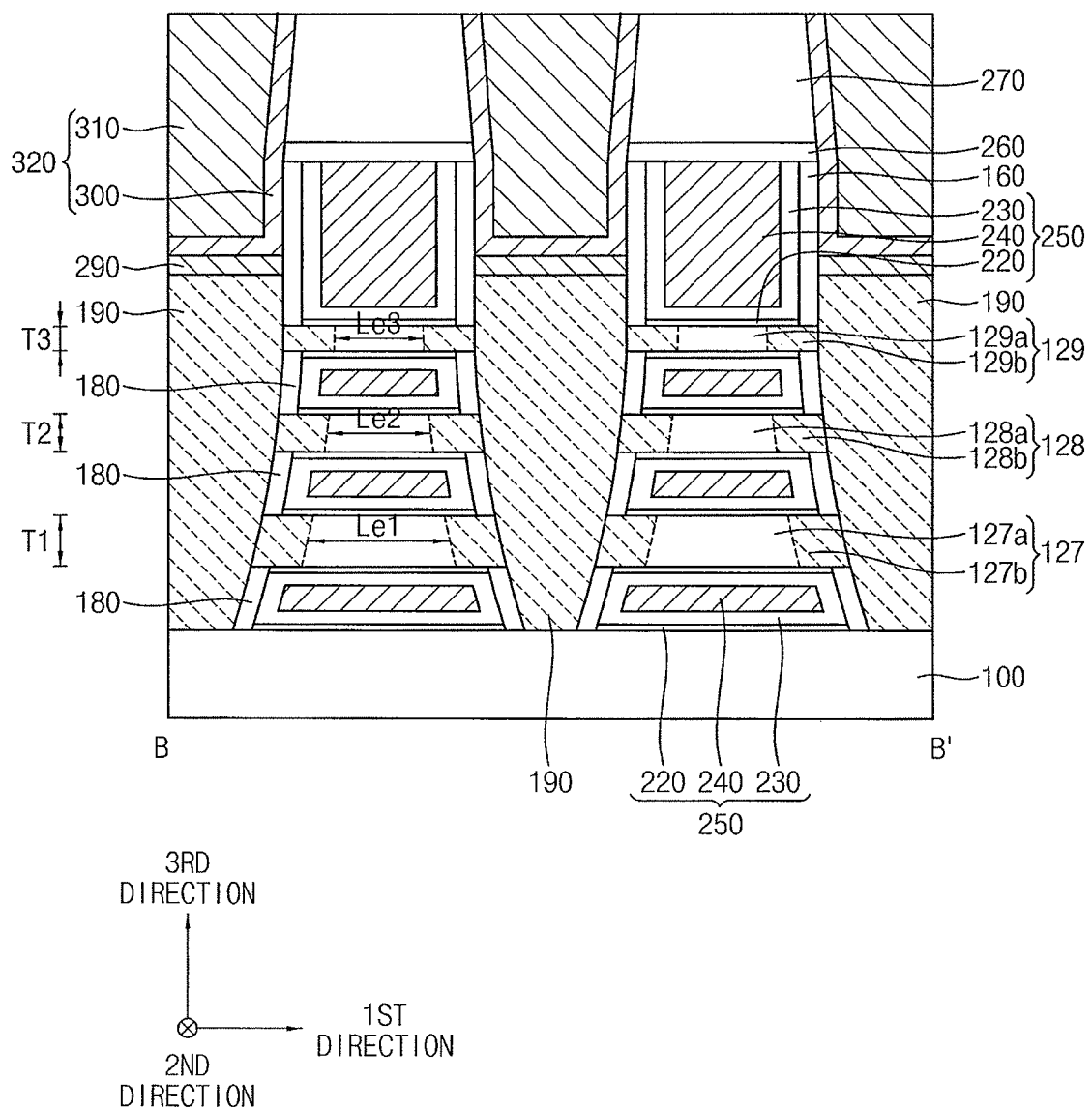
FIG. 28 illustrates another embodiment of a semiconductor device.

FIG. 28 illustrates another embodiment of a semiconductor device, which may be similar to or the same as the semiconductor device in FIGS. 1 through 4, except for shapes or features of the fourth semiconductor layer and the semiconductor patterns. Referring to FIG. 28, the fourth semiconductor layer 190 may have a width in the first direction which gradually decreases in the downward direction. The fourth semiconductor layer 190 may be doped with impurities and may be annealed. The impurity doping profile may correspond to a sidewall profile of the fourth semiconductor layer 190 and may be sloped relative to the top surface of the substrate 100. For example, the first through third end portions 127b, 128b, and 129b of the first through third semiconductor patterns 127, 128, and 129, that are formed by the impurity doping process, may be formed to have a substantially constant length in the first direction.

The channels in the first through third central portions 127a, 128a, and 129a of the first through third semiconductor patterns 127, 128, and 129 may have lengths in the first direction (e.g., effective channel lengths or effective gate lengths) which gradually increase in the downward direction. The first through third semiconductor patterns 127, 128, and 129 may respectively have first through third thicknesses T1, T2, and T3 in the third direction, that increase in the downward direction. Thus, the current flowing through each of the channels may be similar or substantially equal.

Figure 29:
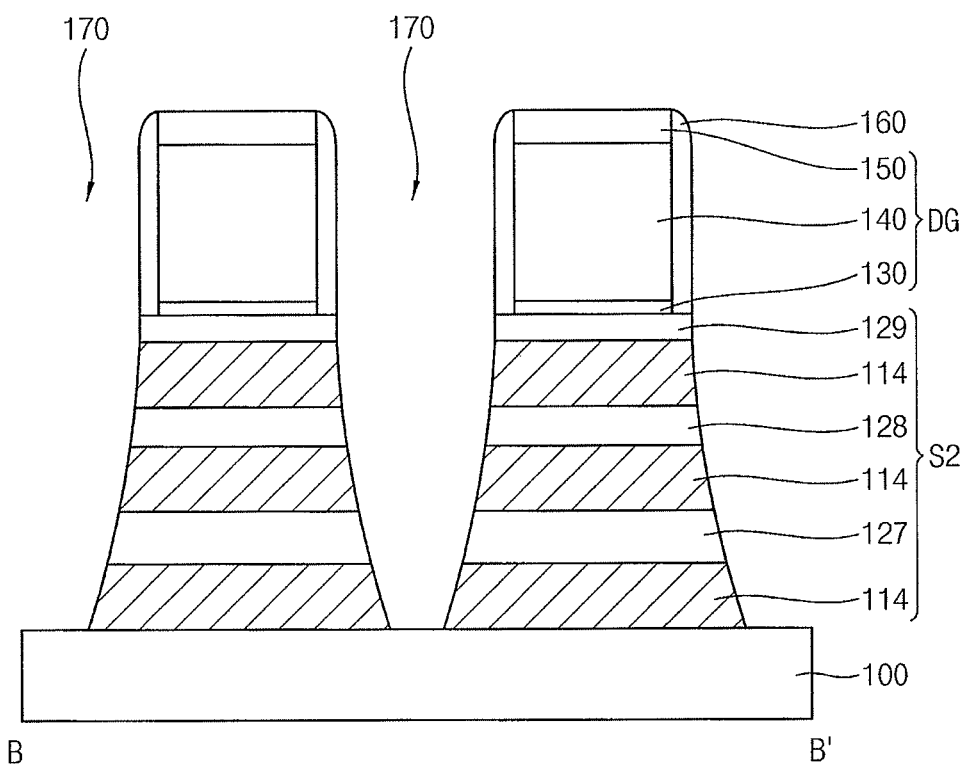
FIGS. 29 and 30 illustrate various stages of another embodiment of a method for fabricating a semiconductor device.
Figure 30:
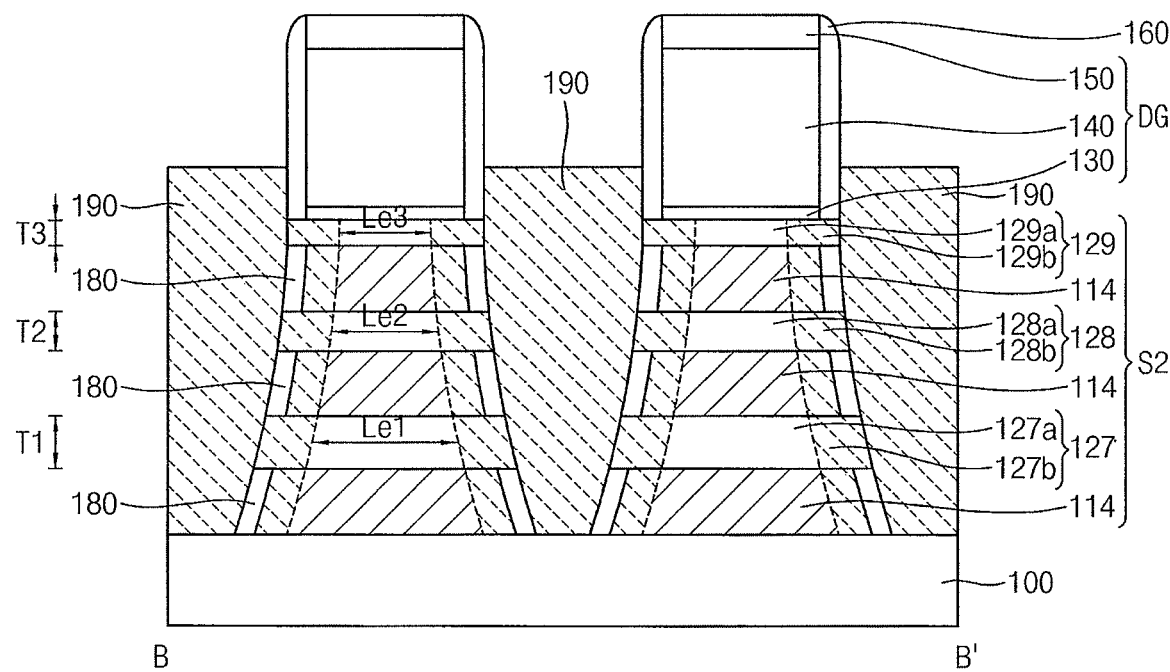
Figure 30:
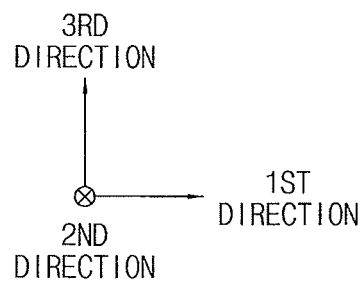

FIGS. 29 and 30 illustrate various stages in another embodiment of a method for fabricating a semiconductor device. This method may include the same or similar processes as those in the method of FIGS. 5 through 27 and FIGS. 1 through 4, except as noted below.

Referring to FIG. 29, the same or similar processes as those in FIGS. 5 through 14 may be performed. However, when the second structure S2 is formed by etching the first structure S1 using the dummy gate structure DG and the gate spacer 160 as the etch mask, according to characteristics of the etching process, the sidewall of the second structure S2 may not be vertical to the top surface of the substrate 100, but rather may be sloped relative to the top surface of the substrate 100. For example, the second structure S2 may have a width in the first direction that gradually increases in the downward direction.

Referring to FIG. 30, the same or similar processes as those in FIGS. 15 through 18 may be performed. Accordingly, the fourth semiconductor layer 190 formed between the second structures S2 may have a width in the first direction which gradually decreases in the downward direction. The fourth semiconductor layer 190 may be doped with impurities and may be annealed. The impurity doping profile may correspond to a sidewall profile of the fourth semiconductor layer 190 and may be sloped relative to the top surface of the substrate 100. For example, the first through third end portions 127b, 128b, and 129b of the first through third semiconductor patterns 127, 128, and 129, that are formed by the impurity doping process, may be formed to have a substantially constant length in the first direction.

The channels in the first through third central portions 127a, 128a, and 129a of the first through third semiconductor patterns 127, 128, and 129 may have lengths in the first direction (e.g., effective channel lengths or effective gate lengths) which gradually increase in the downward direction. The first through third semiconductor patterns 127, 128, and 129 may respectively have first through third thicknesses T1, T2, and T3 in the third direction which increase in the downward direction. Thus, the current flowing through each of the channels may be similar or substantially equal.

Referring again to FIG. 28, the same or similar processes as those in FIGS. 19 through 27 and FIGS. 1 through 4 may be also performed.

Figure 31:
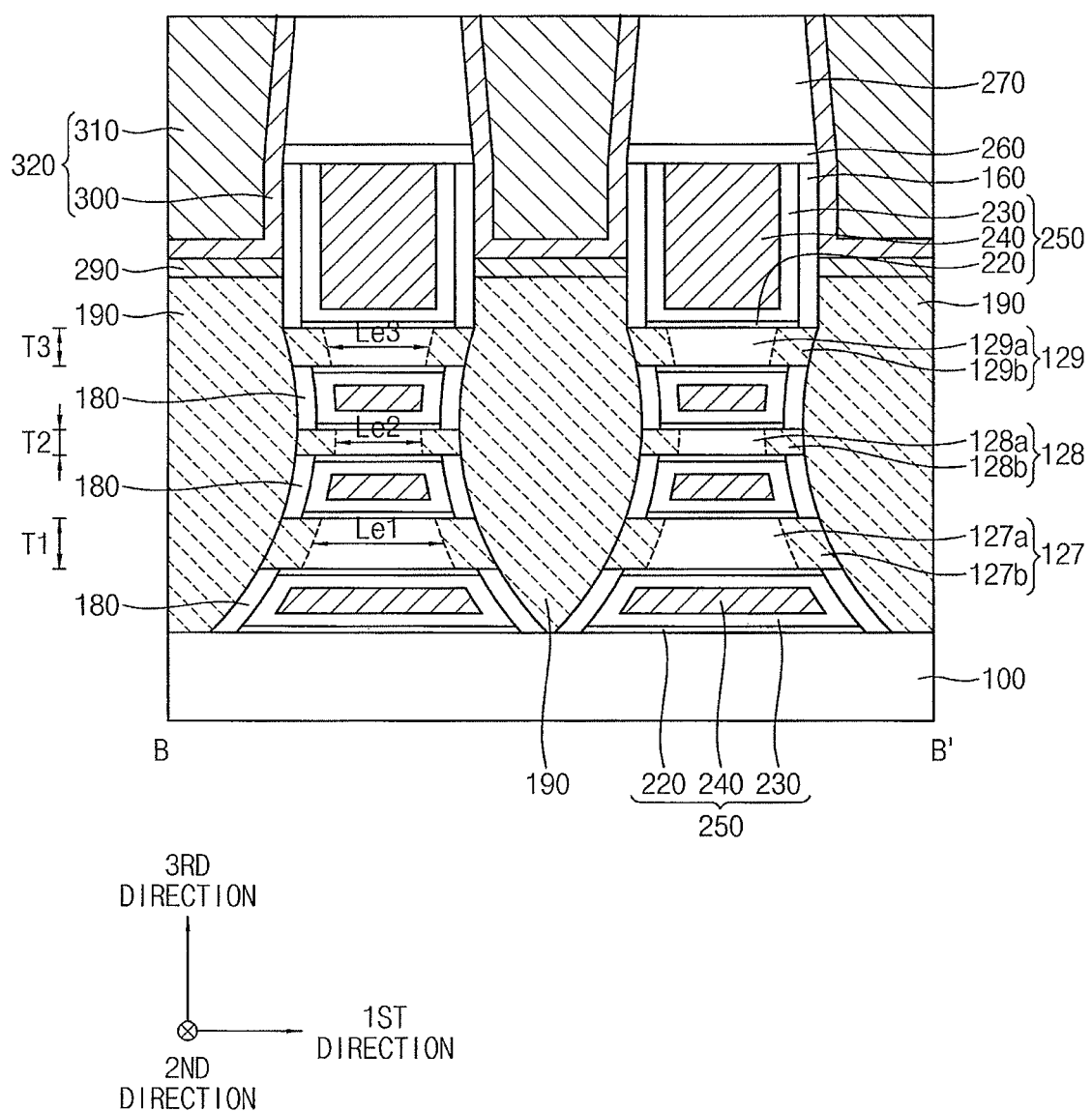
FIG. 31 illustrates another embodiment of a semiconductor device.

FIG. 31 illustrates another embodiment of a semiconductor device, which may be the same as or similar to the semiconductor device in FIGS. 1 through 4, except for shapes or features of the fourth semiconductor layer and the semiconductor patterns.

Referring to FIG. 31, the fourth semiconductor layer 190 may have a greater width in the first direction at a middle portion than at an upper portion or at a lower portion. The width in the first direction at the upper portion is greater than that at the lower portion. The fourth semiconductor layer 190 may be doped with impurities and may be annealed. The impurity doping profile may correspond to a sidewall profile of the fourth semiconductor layer 190. For example, the first through third end portions 127b, 128b, and 129b of the first through third semiconductor patterns 127, 128, and 129, that are formed by the impurity doping process, may be formed to have a substantially constant length in the first direction.

The channels in the first through third central portions 127a, 128a and 129a of the first through third semiconductor patterns 127, 128, and 129 may have lengths in the first direction (e.g., effective channel lengths or effective gate lengths), that vary depending on the level positions of the semiconductor patterns 127, 128, and 129. For example, the first central portion 127a at a lowermost level position may have the greatest length and the second central portion 128a at an intermediate level position may have the smallest length.

The first through third semiconductor patterns 127, 128, and 129 may respectively have first through third thicknesses T1, T2, and T3 in the third direction in a proportional relationship to the lengths of the first through third central portions 127a, 128a, and 129a in the first direction. For example, the first thickness T1 of the first semiconductor pattern 127 at the lowermost level position may be greatest, and the second thickness T2 of the second semiconductor pattern 128 at the intermediate level position may be smallest. Thus, current flowing through each of the channels may be similar or substantially equal.

Figure 32:
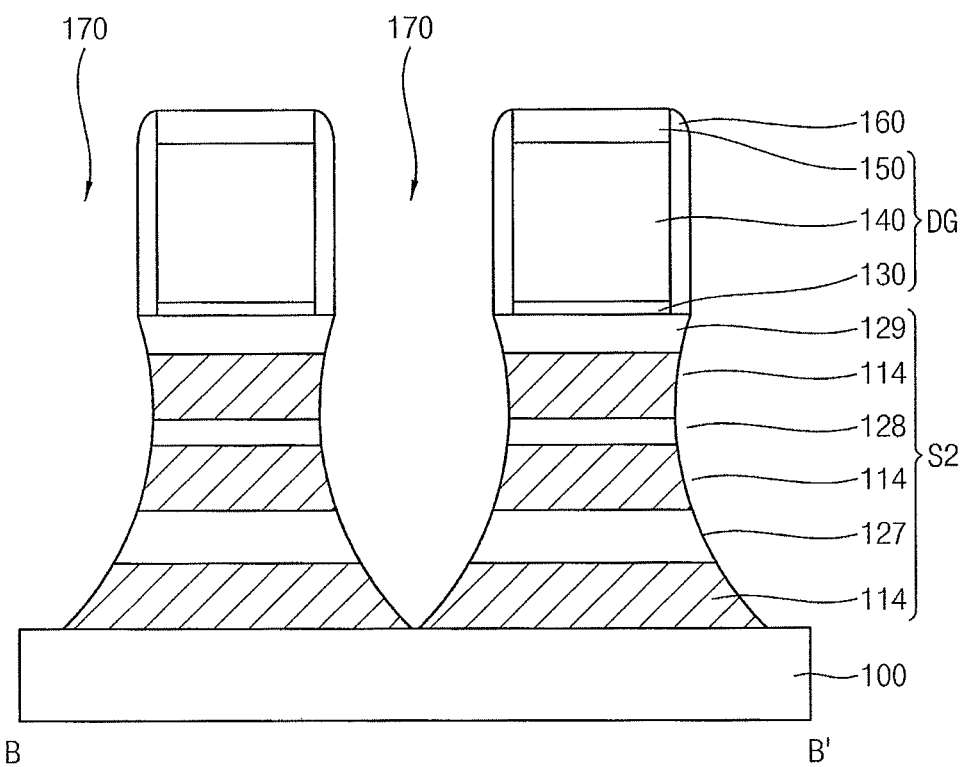
FIGS. 32 and 33 illustrate various stages of another embodiment of a method for fabricating a semiconductor device.
Figure 32:
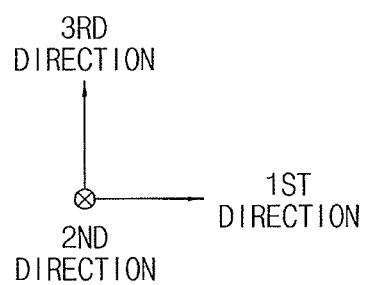
Figure 33:
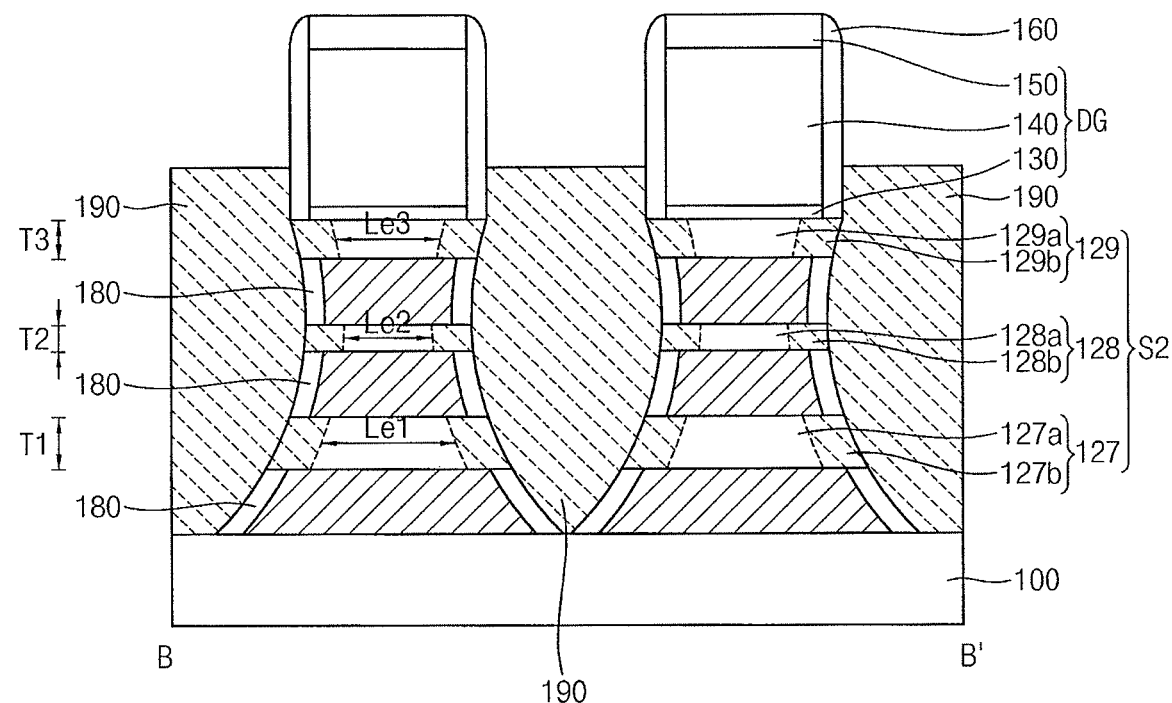
Figure 33:
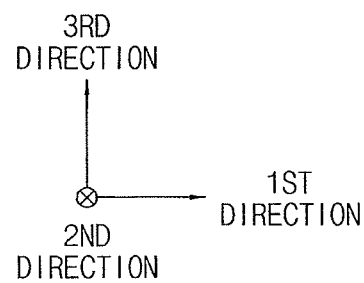

FIGS. 32 and 33 illustrate various stages of another embodiment of a method for fabricating a semiconductor device. This method may include processes which are the same as or similar to processes in FIGS. 5 through 27 and FIGS. 1 through 4, except where noted below.

Referring to FIG. 32, the same or similar processes to those in FIGS. 5 through 14 may be performed. However, when the second structure S2 is formed by etching the first structure S1 using the dummy gate structure DG and the gate spacer 160 as the etch mask, according to characteristics of the etching process, the sidewall of the second structure S2 may not be vertical to the top surface of the substrate 100, but rather may be sloped relative to the top surface of the substrate 100.

In some embodiments, the second structure S2 may have a smaller width in the first direction at a middle portion than at an upper portion or at a lower portion. The width in the first direction at the lower portion may be greater than the width at the upper portion in the first direction.

Referring to FIG. 33, the same or similar processes as those in FIGS. 15 through 18 may be performed. Accordingly, the fourth semiconductor layer 190 formed between the second structures S2 may have a greater width in the first direction at a middle portion than at an upper portion or at a lower portion. The width in the first direction at the upper portion is greater than the width at the lower portion in the first direction. The fourth semiconductor layer 190 may be doped with impurities and may be annealed. The impurity doping profile may be similar to a sidewall profile of the fourth semiconductor layer 190. For example, the first through third end portions 127b, 128b, and 129b of the first through third semiconductor patterns 127, 128, and 129, that are formed by the impurity doping process, may be formed to have a substantially constant length in the first direction.

The channels in the first through third central portions 127a, 128a, and 129a of the first through third semiconductor patterns 127, 128, and 129 may have lengths in the first direction (e.g., effective channel lengths or effective gate lengths), that vary depending on the level positions of the semiconductor patterns 127, 128, and 129. For example, the first central portion 127a at a lowermost level position may have the greatest length, and the second central portion 128a at an intermediate level position may have the smallest length.

The first through third semiconductor patterns 127, 128, and 129 may respectively have first through third thicknesses T1, T2, and T3 in the third direction in a proportional relationship to the lengths of the first through third central portions 127a, 128a, and 129a in the first direction. For example, the first thickness T1 of the first semiconductor pattern 127 at the lowermost level position may be greatest, and the second thickness T2 of the second semiconductor pattern 128 at the intermediate level position may be smallest. Thus, current flowing through each of the channels may be similar or substantially equal.

Referring again to FIG. 31, the same or similar processes as those in FIGS. 19 through 27 and FIGS. 1 through 4 may be additional performed.

Figure 34:
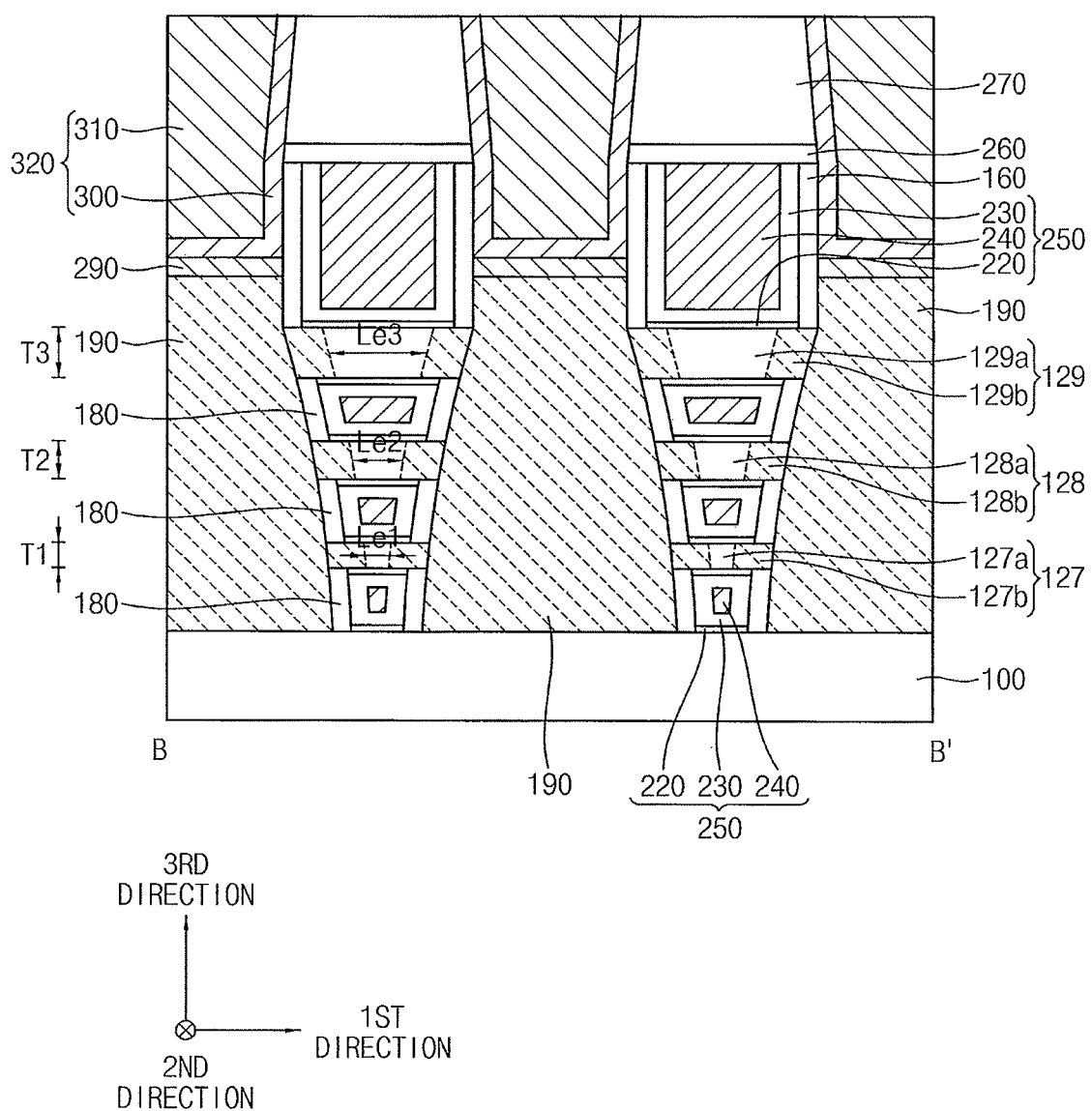
FIG. 34 illustrates another embodiment of a semiconductor device.

FIG. 34 illustrates another embodiment of a semiconductor device, which may be similar to or the same as the semiconductor device in FIGS. 1 through 4, except for shapes or features of the fourth semiconductor layer and the semiconductor patterns. Referring to FIG. 34, the fourth semiconductor layer 190 may have a width in the first direction which gradually increases in the downward direction. The fourth semiconductor layer 190 may be doped with impurities and may be annealed. The impurity doping profile may correspond to a sidewall profile of the fourth semiconductor layer 190. For example, the first through third end portions 127b, 128b, and 129b of the first through third semiconductor patterns 127, 128, and 129, that are formed by the impurity doping process, may have a substantially constant length in the first direction.

The channels in the first through third central portions 127a, 128a, and 129a of the first through third semiconductor patterns 127, 128, and 129 may have lengths in the first direction (e.g., effective channel lengths or effective gate lengths) which gradually decreases in the downward direction. The first through third semiconductor patterns 127, 128, and 129 may respectively have first through third thicknesses T1, T2, and T3 in the third direction which gradually decreases in the downward direction, in proportion to the lengths of the first through third central portions 127a, 128a, and 129a in the first direction. Thus, current flowing through each of the channels may be similar or substantially equal.

Figure 35:
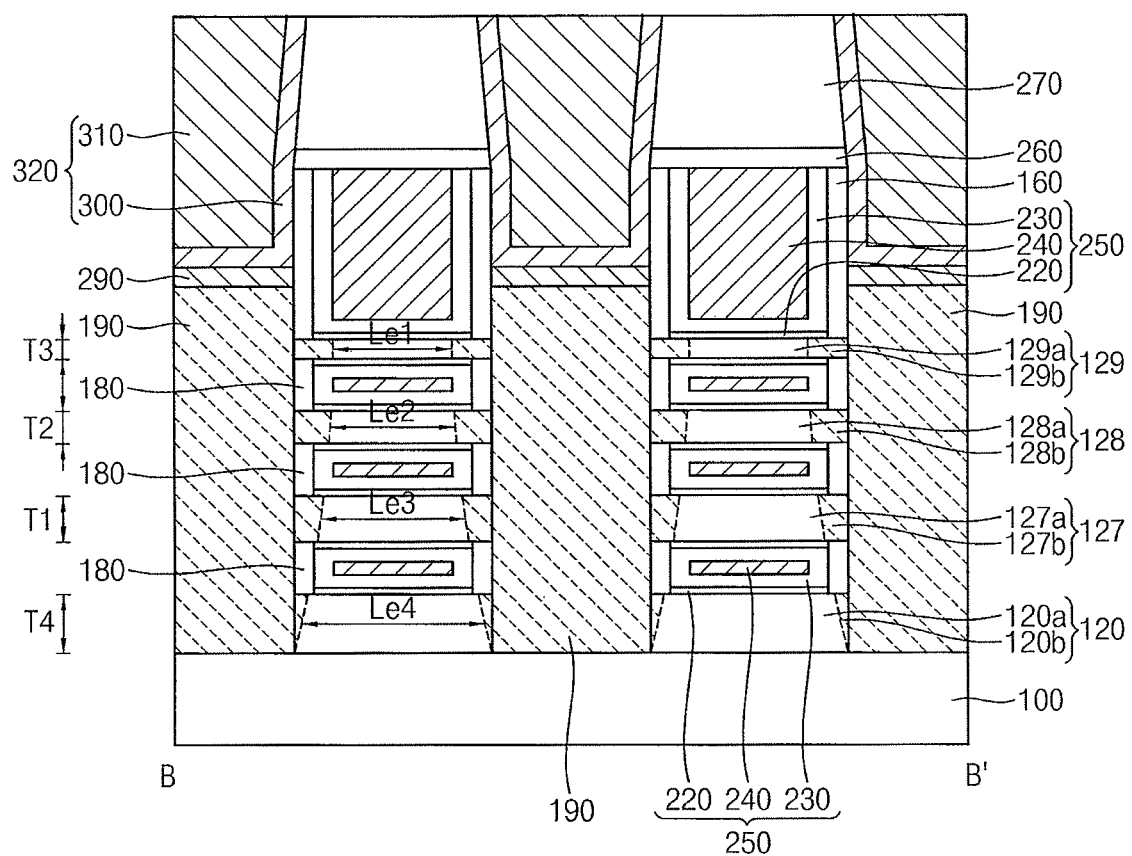
FIG. 35 illustrates another embodiment of a semiconductor device.
Figure 35:
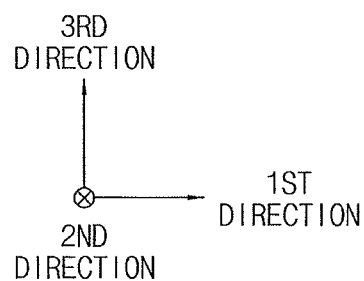

FIG. 35 illustrates another embodiment of a semiconductor device, which may be similar to or the same as the semiconductor device as in FIGS. 1 through 4, except for shapes or features of the fourth semiconductor layer and the semiconductor patterns. Referring to FIG. 35, the semiconductor device may include a fourth semiconductor pattern 120 in addition to the first through third semiconductor patterns 127, 128, and 129. In some embodiments, the fourth semiconductor pattern 120 may be formed between the substrate 100 and the gate structure 250. For example, the fourth semiconductor pattern 120 may further be formed between a bottom surface of the gate structure 250 and the top surface of the substrate 100, such that the gate structure 250 is not in direct contact with the top surface of the substrate 100.

The fourth semiconductor pattern 120 may include a fourth central portion 120a serving as a channel of the transistor and fourth end portions 120b serving as the source/drain layer (e.g., the extension portions of the source/drain layer), similar to the first through third semiconductor patterns 127, 128, and 129.

The fourth end portions 120b may have a length in the first direction less than the lengths of the first through third semiconductor patterns 127, 128, and 129 in the first direction. The central portion 120a may have a length in the first direction (e.g., an effective channel length or effective gate length Le4) greater than lengths (e.g., the effective channel lengths or effective gate lengths Le1, Le2 and Le3) of the first through third central portion 127a, 128a, and 129a in the first direction.

In some embodiments, the semiconductor pattern 120 may have a fourth thickness T4 that is greater than the first through third thicknesses T1, T2, and T3 of the first through third semiconductor patterns 127, 128, and 129. Thus, current flowing through each of the channels may be similar or substantially equal.

A semiconductor device including a plurality of channels vertically stacked as described in accordance with the aforementioned embodiments may be applied to various devices including memory devices and electronic systems. For example, the semiconductor device may be applied to a logic device such as a central processing unit (CPU), a microprocessor unit (MPU) or an application processor (AP). The semiconductor device may be applied to a volatile memory device such as a dynamic random access memory (DRAM) or a static random access memory (SRAM), or a non-volatile memory device such as a flash memory, a phase change random access memory (PRAM), a magnetic random access memory (MRAM), or a resistance random access memory (RRAM).

Example embodiments have been disclosed herein, and although specific terms are employed, they are used and are to be interpreted in a generic and descriptive sense only and not for purpose of limitation. The embodiments (or portions thereof) may be combined to form additional embodiments. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the embodiments disclosed in the specification.

What is claimed is:

1. A semiconductor device, comprising:
first, second and third semiconductor patterns sequentially stacked on a substrate and spaced apart from each other in a first direction perpendicular to an upper surface of the substrate, each of the first, second and third semiconductor patterns extending in a second direction parallel to the upper surface of the substrate;
a gate structure extending on the substrate in a third direction parallel to the upper surface of the substrate and crossing the second direction and at least partially enclosing each of the first, second and third semiconductor patterns, the gate structure including first, second and third portions sequentially stacked in the first direction, the first portion disposed between the upper surface of the substrate and the first semiconductor pattern, the second portion disposed between the first semiconductor pattern and the second semiconductor pattern, and the third portion disposed between the second semiconductor pattern and the third semiconductor pattern; and
an epitaxial layer at a side of the gate structure in the second direction, the epitaxial layer being connected to the first, second and third semiconductor patterns,
wherein first, second and third channels are formed in the first, second and third semiconductor patterns, respectively, and
wherein a minimum length in the second direction of the first channel is greater than a minimum length in the second direction of the second channel and a minimum length in the second direction of the third channel.

2. The semiconductor device as claimed in claim 1, wherein a width in the second direction of the first portion of the gate structure is greater than a width in the second direction of the second portion of the gate structure, and the width in the second direction of the second portion of the gate structure is greater than a width in the second direction of the third portion of the gate structure.

3. The semiconductor device as claimed in claim 1, wherein the minimum length in the second direction of the second channel is greater than the minimum length in the second direction of the third channel.

4. The semiconductor device as claimed in claim 1, wherein the minimum length in the second direction of the third channel is greater than the minimum length in the second direction of the second channel.

5. The semiconductor device as claimed in claim 1, wherein a width of the epitaxial layer in the second direction gradually decreases in a downward direction from a height of a top of the first channel.

6. The semiconductor device as claimed in claim 1, wherein a width of the epitaxial layer in the second direction gradually decreases in a downward direction from a height of a top of the second channel.

7. The semiconductor device as claimed in claim 1, wherein the epitaxial layer and end portions of the first, second and third semiconductor patterns, respectively, in the second direction form a source/drain layer, and
wherein a width of the end portion of the third semiconductor pattern in the second direction is greater than a width of the end portion of the second semiconductor pattern in the second direction, and the width of the end portion of the second semiconductor pattern in the second direction is greater than a width of the end portion of the first semiconductor pattern in the second direction.

8. The semiconductor device as claimed in claim 7, wherein a width in the second direction of each of the end portions of the respective first, second and third semiconductor patterns gradually decreases in a downward direction from a top toward a bottom thereof.

9. The semiconductor device as claimed in claim 1, wherein a height of an uppermost surface of the epitaxial layer is different from a height of an upper surface of the third portion of the gate structure.

10. The semiconductor device as claimed in claim 1, wherein the gate structure further includes a fourth portion on the third semiconductor pattern, and
wherein the gate structure includes a gate insulating pattern and a gate electrode, the gate insulating pattern including a high-k dielectric material and the gate electrode including a metal.

11. The semiconductor device as claimed in claim 1, further comprising a contact plug contacting the epitaxial layer,
wherein a height of a lowermost surface of the contact plug is different from a height of a lower surface of the third portion of the gate structure.

12. The semiconductor device as claimed in claim 1, wherein the gate structure is one of a plurality of gate structures spaced apart from each other in the second direction, and the epitaxial layer is disposed between ones of the plurality of gate structures neighboring in the second direction,
wherein the semiconductor device further comprises first, second and third inner spacers between the epitaxial layer and the first, second and third portions, respectively, of each of the neighboring ones of the plurality of gate structures.

13. The semiconductor device as claimed in claim 12, wherein a distance between the third inner spacers in the second direction is greater than a distance between the first inner spacers in the second direction.

14. The semiconductor device as claimed in claim 12, wherein the distance between the third inner spacers in the second direction is greater than a distance between the second inner spacers in the second direction, and the distance between the second inner spacers in the second direction is greater than a distance between the first inner spacers in the second direction.

15. The semiconductor device as claimed in claim 1, wherein the first semiconductor pattern is one of a pair of first semiconductor patterns spaced apart from each other in the third direction, the second semiconductor pattern is one of a pair of second semiconductor patterns spaced apart from each other in the third direction, and the third semiconductor pattern is one of a pair of third semiconductor patterns spaced apart from each other in the third direction, and
wherein the gate structure at least partially encloses each of the pair of first semiconductor patterns, each of the pair of second semiconductor patterns, and each of the pair of third semiconductor patterns.

16. The semiconductor device as claimed in claim 1, wherein the semiconductor device further comprises:
fourth, fifth and sixth semiconductor patterns sequentially stacked on a substrate and spaced apart from each other in the first direction, each of the fourth, fifth and sixth semiconductor patterns extending in the second direction;

a second gate structure extending on the substrate in the third direction and at least partially enclosing each of the fourth, fifth and sixth semiconductor patterns, the second gate structure including fourth, fifth and sixth portions sequentially stacked in the first direction, the fourth portion disposed between the upper surface of the substrate and the fourth semiconductor pattern, the fifth portion disposed between the fourth semiconductor pattern and the fifth semiconductor pattern, and the sixth portion disposed between the fifth semiconductor pattern and the sixth semiconductor pattern; and a second epitaxial layer at a side of the second gate structure in the second direction, the second epitaxial layer being connected to the fourth, fifth and sixth semiconductor patterns and doped with p-type impurities, and wherein fourth, fifth and sixth channels are formed in the fourth, fifth and sixth semiconductor patterns, respectively.

17. The semiconductor device as claimed in claim 16, wherein the fourth, fifth and sixth portions of the second gate structure have substantially a same width in the second direction.

18. The semiconductor device as claimed in claim 16, wherein a length in the second direction of the sixth channel is greater than a length in the second direction of the fifth channel or a length in the second direction of the fourth channel.

19. A semiconductor device, comprising:
a first transistor on a substrate, the first transistor including:
first, second and third semiconductor patterns sequentially stacked on the substrate and spaced apart from each other in a first direction perpendicular to an upper surface of the substrate, each of the first, second and third semiconductor patterns extending in a second direction parallel to the upper surface of the substrate;
a first gate structure extending on the substrate in a third direction parallel to the upper surface of the substrate and crossing the second direction and at least partially enclosing each of the first, second and third semiconductor patterns, the first gate structure including first, second and third portions sequentially stacked in the first direction, the first portion disposed between the upper surface of the substrate and the first semiconductor pattern, the second portion disposed between the first semiconductor pattern and the second semiconductor pattern, and the third portion disposed between the second semiconductor pattern and the third semiconductor pattern; and
a first epitaxial layer at a side of the first gate structure in the second direction, the first epitaxial layer being connected to the first, second and third semiconductor patterns and doped with n-type impurities; and a second transistor on the substrate, the second transistor including:
fourth, fifth and sixth semiconductor patterns sequentially stacked on the substrate and spaced apart from each other in the first direction, each of the fourth, fifth and sixth semiconductor patterns extending in the second direction;
a second gate structure extending on the substrate in the third direction and at least partially enclosing each of the fourth, fifth and sixth semiconductor patterns, the second gate structure including fourth, fifth and sixth portions sequentially stacked in the first direction, the fourth portion disposed between the upper surface of the substrate and the fourth semiconductor pattern, the fifth portion disposed between the fourth semiconductor pattern and the fifth semiconductor pattern, and the sixth portion disposed between the fifth semiconductor pattern and the sixth semiconductor pattern; and
a second epitaxial layer at a side of the second gate structure in the second direction, the second epitaxial layer being connected to the fourth, fifth and sixth semiconductor patterns and doped with p-type impurities, wherein a minimum length in the second direction of the first channel is greater than a minimum length in the second direction of the second channel and a minimum length in the second direction of the third channel.

20. The semiconductor device as claimed in claim 19, wherein a width in the second direction of the first portion of the gate structure is greater than a width in the second direction of the second portion of the gate structure, and the width in the second direction of the second portion of the gate structure is greater than a width in the second direction of the third portion of the gate structure, and wherein the fourth, fifth and sixth portions of the second gate structure have substantially a same width in the second direction.

* * * * *